(12) United States Patent
Rajski

(10) Patent No.: US 6,662,327 B1
(45) Date of Patent: Dec. 9, 2003

(54) METHOD FOR CLUSTERED TEST PATTERN GENERATION

(76) Inventor: Janusz Rajski, 6502 Horton Rd., West Linn, OR (US) 97068-2847

( * ) Notice: Subject to any disclaimer, the term of this patent is extended or adjusted under 35 U.S.C. 154(b) by 0 days.

(21) Appl. No.: 09/317,067

(22) Filed: May 13, 1999

Related U.S. Application Data
(60) Provisional application No. 60/085,327, filed on May 13, 1998.

(51) Int. Cl.$^7$ ............................................. G01R 31/317
(52) U.S. Cl. ......................... 714/738; 714/739; 714/741
(58) Field of Search ........................ 714/738, 739–744, 714/724, 725–731, 733, 30, 42; 324/73; 326/16, 21; 702/123; 703/28; 716/1; 708/250

(56) References Cited

U.S. PATENT DOCUMENTS

| | | | |
|---|---|---|---|
| 4,687,988 A | | 8/1987 | Eichelberger et al. |
| 5,043,988 A | | 8/1991 | Brglez et al. |
| 5,297,151 A | | 3/1994 | Gruetzner et al. |
| 5,323,400 A | | 6/1994 | Agarwal et al. |
| 5,394,405 A | | 2/1995 | Savir |
| 5,570,375 A | * | 10/1996 | Tsai et al. .................... 714/30 |
| 5,596,587 A | * | 1/1997 | Douglas et al. ............. 702/123 |
| 5,612,963 A | * | 3/1997 | Koenemann et al. ....... 714/739 |
| 5,737,340 A | | 4/1998 | Tamarapalli |
| 5,983,380 A | * | 11/1999 | Motika et al. ............... 714/733 |
| 6,243,843 B1 | * | 6/2001 | Parker et al. ................ 714/726 |
| 6,377,912 B1 | * | 4/2002 | Sample et al. ................ 703/28 |

OTHER PUBLICATIONS

"A Tutorial on Built–In Self Test, Part 1: Principles," *IEEE Design and Test of Computers*, by V.D. Agrawal, C.K. Kime and K.K. Saluja, 1993, pp. 73–82.

"Test Point Insertion for Scan–Based BIST," *Proceedings of European Test Conference*, by B.H. Seiss, P.M. Trouborst and M.H. Schulz, 1991, pp. 253–252.

"Constructive Multi–Phase Test Point Insertion for Scan–Based BIST," *Proceedings of International Test Conference*, by N. Tamarapalli and J. Rajski, 1995, pp. 649–658.

"LFSR–Coded Test Patterns for Scan Designs," *Proceedings of European Test Conference*, by B. Könemann, 1991, pp. 237–242.

"Two–dimensional Test Data Decompressor for Multiple Scan Designs," *International Test Conference*, by N. Zacharia, J. Rajski and J. Tyszer, 1996, pp. 186–194.

"Cube–contained Random Patterns and their Application to the Complete Testing of Synthesized Multi–Level Circuits," *Proceedings of International Test Conference*, by S. Pateras and J. Rajski, 1991, pp. 473–482.

* cited by examiner

*Primary Examiner*—Christine T. Tu
*Assistant Examiner*—Guy Lamarre
(74) *Attorney, Agent, or Firm*—Klarquist Sparkman LLP

(57) ABSTRACT

A method for clustered pattern generation maintains high fault coverage of a circuit under test while it reduces the amount of test data to store by using clusters of correlated test patterns. A test pattern generator stores only a small number of center test vectors which serve as centers of clusters. The generator applies each center test vector to a circuit under test multiple times. However, every time the center vector is shifted into the circuit, some of its positions are complemented. The cluster may have a number of spheres which correspond to test vectors derived with various diffraction probabilities and computed to maximize fault coverage, minimize the total number of clusters, and reduce the test application time. The method also encodes several partially specified center test vectors in scan path using the polarity between scan cells, scan order and waveform generators controlling scan inputs.

24 Claims, 20 Drawing Sheets

METHOD FOR CLUSTERED TEST PATTERN GENERATION

RELATED APPLICATION DATA

This patent is based on U.S. Provisional Patent Application No. 60/085,327, filed May 13, 1998.

FIELD OF THE INVENTION

This invention relates generally to the testing of very large scale integration (VLSI) circuits using test patterns (also know as test vectors) that are applied to scan paths within circuits. More particularly, this invention relates to the generation of test patterns for finding random pattern-resistant faults within a VLSI circuit.

BACKGROUND OF THE INVENTION

Most modern digital integrated circuits incorporate a variety of design for testability (DFT) features such as scan path or partial scan to make their testing and diagnosis possible. In test mode, all flip-flops in a full scan design are configured into one or more shift registers called scan paths, with each of the flip flops being a cell of the scan path. This solution provides an excellent controllability and observability of all memory elements in a circuit. Arbitrary test patterns can be applied to the combinational part of the circuit, and its test responses can be observed on the scan cells by a simple shift operation.

The test patterns can be computed and applied in several different ways. One popular approach is to use automatic test pattern generation (ATPG) to compute the test patterns and apply them with a testing device to the circuit under test. The testing device stores the test patterns explicitly, applies them to the circuit under test, and compares the circuit responses to ideal responses to determine if the circuit operates correctly. The ATPG tools available today can generate test patterns with a high degree of fault coverage (i.e., the percentage of possible circuit faults that are detectable) for VLSI circuits. But the storage needed for the large number of test patterns required can easily exceed the testing device's storage capacity.

An alternative to ATPG is Built-In Self Test (BIST), which does not store test patterns. The general state of the art in this area is summarized by V. D. Agrawal, C. K. Kime, and K. K. Saluja, in "A Tutorial on Built-In Self Test, Part 1: Principles," *IEEE Design and Test of Computers*, March 1993, pp. 73–82, which is incorporated herein by reference. In BIST, hardware within the circuit under test generates test patterns, evaluates test responses, and controls the test application. One popular BIST architecture uses scan paths as a basic DFT technique, Pseudorandom Pattern Generators (PRPG) as sources of test patterns, and multiple input signature registers (MISR) as compactors of test responses. The PRPG uses a linear feedback shift register (LFSR) or a cellular automata (CA) as a source of test patterns capable of generating sequences of millions of test pattern without repetition. The PRPG generates pseudorandom test patterns that are shifted to the circuit under test through scan and boundary scan. Once a test pattern is shifted, the circuit is reconfigured into normal system mode for at least one clock cycle to load the response back to the scan path. At this point the responses are shifted out, while at the same time a new test pattern is shifted in. The test responses obtained from shifting of many scan chains are compacted into a signature. The control circuitry provides the necessary signals which control the test application, determine the number of test patterns applied, the length of the shift operation, etc. The BIST control circuitry on an integrated circuit may be connected to and driven by the IEEE 1149.1 TAP controller. In this case it might be possible to load the initial seed of the PRPG, the number of test patterns to be applied, and read the final signature.

It has been found, however, that many real circuits are resistant to pseudorandom pattern testing. A simple example of such a circuit is a 32-input AND gate. A test for stuck-at-0 fault on the output of this AND gate requires that all 32 inputs assume a value 1. A PRPG which generates test patterns with A 50% probability of a logic 1 on each input must generate on average four billion patterns to detect the fault, a prohibitively large number.

One approach to eliminate random pattern resistance is presented by B. H. Seiss, P. M. Trouborst and M. H. Schulz in "Test Point Insertion for Scan-Based BIST," *Proceedings of European Test Conference*, 1991, pp.253–262, which is incorporated herein by reference. This approach relies on the insertion of control and observation points into the circuit to increase the controllability and observability of critical areas of the circuit so that faults in these areas can be detected by the application of pseudorandom test patterns. The control points are inserted into the circuit as additional gates or additional inputs to gates. They are disabled in the normal mode, and they do not alter the circuit function (though they may affect circuit delay). In test mode, control points are driven by additional scan cells connected to a PRPG.

This approach addresses the problem of random pattern resistance, but it has some disadvantages. First, there is additional circuit area overhead required for the control points, observation points, and the scan cells to drive them. On average one test point requires ten additional gates. Second, since the control points are driven by the additional scan cells, the points must switch at the same rate as any other inputs to the combinational logic. If BIST is to be applied at-speed, these signals have to be routed with the same timing constraints as any other signals in the circuit logic. Third, due to additional switching on the control points, there is an increased power dissipation during test mode.

Another approach is presented by N. Tamarapalli and J. Rajski in "Constructive Multi-Phase Test Point Insertion for Scan-Based BIST," *Proceedings of International Test Conference*," pp. 649–658, 1996, and in U.S. Pat. No. 5,737,340, which are incorporated herein by reference. Multi-phase test point insertion (MTPI) is used to activate the control points in a number of phases. A divide-and-conquer technique partitions the whole test into a number of phases, and a phase decoder circuit activates a subset of control points by applying fixed values for the duration of the phase. The algorithm assigning control points in a given phase targets the faults which remain undetected after the previous phases. The assignments work synergistically to detect the faults while avoiding conflicting assignments, which are activated in different phases. This approach maximizes the fault coverage and minimizes area overhead and power dissipation. It, however, requires that a test point be inserted in every circuit area containing undetected faults. If the area contains very few faults, the returns per insertion increasingly diminish.

For circuits where the insertion of test points is not possible, such as legacy designs, or not desirable due to a possible impact on area performance or design flow, several other techniques have been developed to reduce the amount of test data to store. In weighted random pattern testing, pseudorandom patterns are biased, i.e. the probability of generating logic states 0 and 1 may be different For example, if weighted random patterns are applied to test completely a 32-input AND gate, the optimum probability of value 1 is $31/32$, and consequently $1/32$ for value 0. For those values the average test length of a complete test is approximately 350 patterns, as opposed to four billion for equiprobable patterns. Although the test length is reduced significantly, the method requires storage of weights, i.e., the signal probabilities for each input or scan cell of the circuit. In this example, one set of signal probabilities was used. It has been demonstrated that real circuits require multiple weight sets, in some instances more than a hundred. Each weight set specifies signal probabilities for all inputs of the circuit. It involves up to four bits of data per scan cell. Although this is a significant reduction of data compared to explicit storage of test data, the amount of test data to store is still significant for large circuits. A number of weighted random pattern (WRP) generators are known such as those disclosed in U.S. Pat. Nos. 5,394,405; 5,043,988; 5,297,151; and 4,687,988. However, these WRP generators are significantly more complex than uniform pseudorandom pattern generators, and their use have been restricted to off-chip BIST.

Another weighted testing approach is presented by S. Pateras and J. Rajski in "Cube-Contained Random Patterns and Their Application to the Complete Testing of Synthesized Multi-Level Circuits," *Proceedings of International Test Conference*, pp. 473–482, 1991, which is incorporated herein by reference. In this method the granularity of weights has been reduced to just three: 0%, 100% and 50%. In one part of the test in which test patterns are generated from a single weight set, some inputs assume a constant value of logic 0 (0%), constant values of logic 1 (100%) or pseudorandom signals with equal probability of 0 and 1 (50%). Since only two bits are required per scan cell for each weight set to store, the complexity of the WRP generator is reduced. The method requires more weight sets to compensate for the reduced granularity of signal probabilities.

U.S. Pat. No. 5,323,400, which is incorporated herein by reference, discloses another weighted testing approach in using a scan cell with reduced set weighted random patterns. The scan cell contains a logic gate on its output. The gate is inserted between the conventional scan cell and the combinational logic. There are two different types of scan cells to produce constant values: one type in test mode produces value 0 on its output, another type produces 1. Two other types of scan cells can produce random signals with probability 0.25 and 0.75. This solution implements a single weight set random patterns. Since most real circuits require multiple weights to obtain satisfactory fault coverage, this solution may not guarantee high quality of testing. In addition, each scan cell with this modification introduces one gate delay to the circuit, causing its performance to degrade.

Yet another testing approach is presented by B. Chinaman in "LFSR-Coded Test Patterns for Scan Designs," *Proceedings of European Test Conference*, pp.237–242, 1991, which is incorporated herein by reference. This approach combines the benefit of pseudorandom and deterministic patterns. Pseudorandom patterns detect a majority of faults, and a ATPG tool targets the remaining random pattern-resistant faults, generating test cubes or partially specified test patterns with unspecified positions. A solver program uses these test cubes to determine the seeds of the PRPG such that when they are loaded to the LFSR and clocked into the circuit, they produce test patterns which agree on all specified positions of the test cubes. This technique does not require any circuit modification other than scan path. It relies on ATPG tool and provides an effective compression technique for deterministically computed incompletely specified test patterns. This technique usually provides as high a fault coverage as the ATPG tool on which it is based. The size of the seed may be much larger than the length of the PRPG. The main drawback of this method is the overhead of a long LFSR and the amount of data (one seed per test pattern).

A method has been proposed by N. Zacharia, J. Rajski and J. Tyszer in "Two-dimensional Test Data Decompressor for Multiple Scan designs, " *International Test Conference*, 1996, pp. 186–194, which is incorporated herein by reference, where the scan elements can be used to extend the length of the PRPG required for reseeding without incurring significant area overhead. A small number of patterns is sufficient to test all random pattern-resistant faults. Although this method reduces the hardware overhead, the amount of test data to store is still quite significant. For every test cube, there is one seed which has to be stored.

For the reasons given, none of these prior testing approaches effectively detects random pattern-resistant faults as efficiently as may be desired. An objective of the invention, therefore, is to provide a low cost yet efficient method for detecting faults in circuits under test.

SUMMARY OF THE INVENTION

The method maintains high fault coverage of a circuit under test while it reduces the amount of test data to store by using clusters of correlated test patterns. A test pattern generator stores only a small number of center test vectors which serve as centers of clusters. The generator applies each center test vector to a circuit under test multiple times. However, every time the center vector is shifted into the circuit, some of its positions are complemented. The cluster may have a number of spheres which correspond to test vectors derived with various diffraction probabilities and computed to maximize fault coverage, minimize the total number of clusters, and reduce the test application time. The method also encodes several partially specified center test vectors in scan path using the polarity between scan cells, scan order and waveform generators controlling scan inputs.

More specifically, a method in accordance with the invention is disclosed for generating multiple weighted test patterns from an initial test pattern. The method comprises copying a multibit initial test pattern from an initial location; generating a set of weighting factor bits; combining the weighting factor bits with the copied initial test pattern bits to form a multibit weighted test pattern; and repeating the copying, generating and combining to form multiple weighted test patterns from the initial test pattern.

Also disclosed is a method for determining a test pattern for detecting faults within a circuit. The method comprises performing a fault simulation of the circuit to identify a list of random pattern-resistant faults therein; generating a set of multi-bit test patterns that detects a desired share of the random pattern-resistant faults; selecting from the set a test pattern that detects a desired number of the random pattern-resistant faults; and filling one or more don't care bit positions of the selected test pattern with bit values computed from the unselected test patterns to determine the test pattern.

The foregoing and other aspects of the invention will become more apparent from the following detailed description of a preferred embodiment which proceeds with reference to the accompanying drawings.

DETAILED DESCRIPTION OF AN ILLUSTRATIVE EMBODIMENT

Overview

Figure 1:
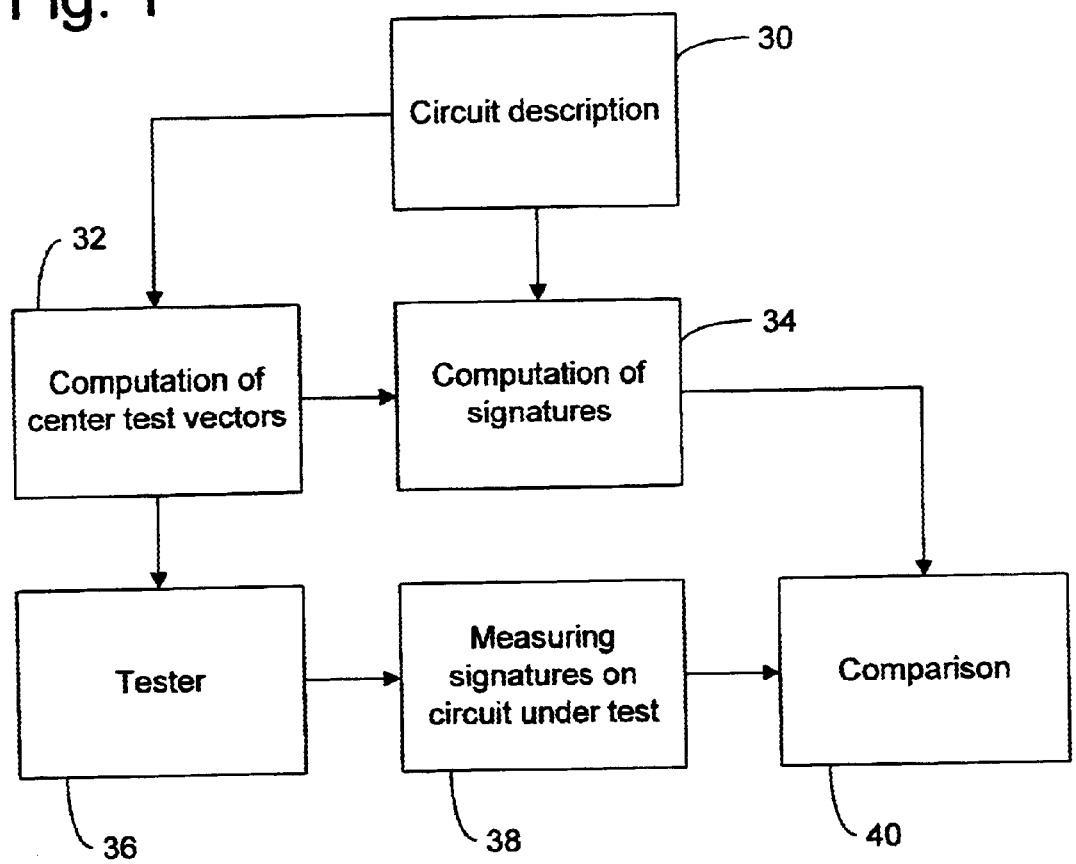
FIG. 1 is a flowchart of a method for testing digital circuits.

FIG. 1 is a flowchart of a method for testing such a circuit according to the invention. A computer program or equivalent device reads the ideal description of a circuit to be tested (30) and computes clusters of test patterns (32). Each cluster consists of a center pattern and a number of other patterns derived from the center pattern by complementing some of its positions. From the test patterns and the ideal circuit description, expected circuit signatures are computed for later comparison against actual signature (34).

A tester then tests an actual circuit by applying the clusters of test patterns. The tester, however, does not have to store the clusters. Instead, it stores only the center test patterns, the diffraction probabilities, and an initial seed. In addition, a seed and a polynomial are stored so that a diffractor circuit can reproduce exactly the same sequence of patterns as the ones produced for the ideal circuit. The tester applies the center patterns repeatedly, every time complementing some positions in a pseudorandom manner (36). The process is fully deterministic, i.e. the tester reproduces exactly the same patterns as the ones computed as part of the test of the ideal circuit. The tester also computes the actual signature from the responses of the device under test (38). The actual signature is then compared to the circuit's expected signature (40). If the signatures match, the circuit is declared good; if they do not, the circuit is considered faulty.

Figure 2:
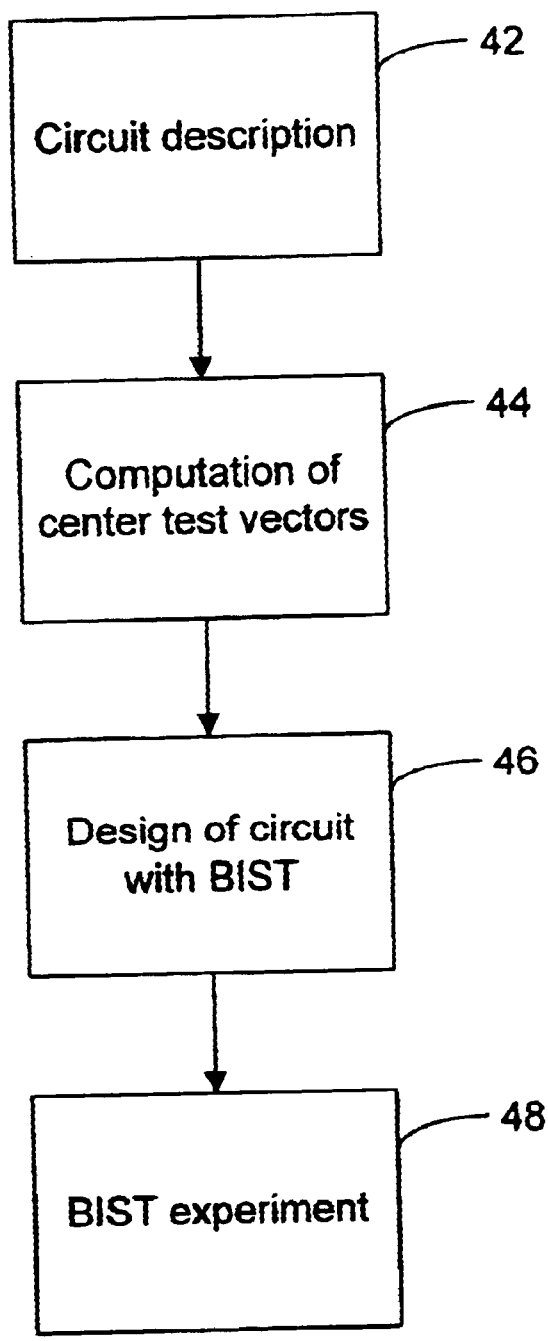
FIG. 2 is a flowchart of a method for self-testing of digital circuits.

Another implementation of the method of the invention is illustrated in FIG. 2. Here the center patterns are encoded in scan chains of the circuit under test (42–48). The encoding is incorporated in the circuit design, and the circuit is manufactured with the test information embedded in it (BIST). The multiple center patterns are encoded by proper selection of scan chain order and polarity between scan cells. A wave form generator and diffractor circuit also incorporated in the circuit under test regenerate the patterns without the need for external equipment. Once the circuit is fabricated, the testing is performed with the help of the built-in self test hardware. Only rudimentary assistance from the external testing equipment may be required. During the test experiment also a signature is computed by an on-chip signature register.

The basis of this invention is confirmed by experimental results performed on many circuits. In one experiment performed on one of the largest ISCAS benchmark circuits, an ATPG program generated 70 compact test cubes for the random pattern-resistant faults obtained after simulating 32 k pseudo-random patterns. Each of the 70 cubes served as a center pattern of two thousand derived patterns with diffraction probability 0.5 and two thousand patterns with diffraction probability 0.25. Four thousand pseudorandom patterns yielded 89.34% fault coverage. Each center pattern on average covered an additional 1.04%, bringing the combined coverage to 90.38%. Each center test pattern with four thousand derived patterns on average yields 96.34%. In other words, 4 k of the patterns derived from a center test pattern cover 5.96% more faults than 4 k of pseudorandom unbiased patterns.

The results clearly show that the concept of generating spherical pseudorandom pattern around the deterministically computed center patterns is very powerful. The spherical patterns were able to detect a large percentage of difficult to test faults which were neither covered by the same number of pseudorandom patterns nor by the center deterministic pattern. In fact many other faults, which cannot be tested by the center pattern due to conflicting assingments, are covered by the derived patterns.

The process of generating center patterns can be repeated iteratively, i.e. at the beginning the method selects the cluster which covers the largest number of faults, and it repeats the process for the remaining faults.

TABLE 1

| Circuit | Target faults | 32k random patterns | Phase 1 | Phase 2 | Phase 3 | Phase 4 |
|---------|---------------|---------------------|---------|---------|---------|---------|
| C2670   | 2478          | 97.47%              | 97.22%  | 99.27%  | 99.88%  | 99.96%  |
| C7552   | 7417          | 96.00%              | 98.50%  | 99.54%  | 99.72%  | 99.81%  |
| S838.1  | 933           | 80.72%              | 80.72%  | 97.32%  | 99.25%  | 99.58%  |
| S5378   | 4681          | 99.51%              | 98.72%  | 99.72%  | 99.96%  | 100.00% |
| S9234   | 6641          | 90.84%              | 93.92%  | 98.67%  | 99.50%  | 99.87%  |
| S13207  | 10340         | 97.93%              | 95.23%  | 98.90%  | 99.94%  | 100.00% |
| S15850  | 11564         | 95.44%              | 97.57%  | 99.89%  | 99.99%  | 100.00% |
| S38417  | 33039         | 95.68%              | 98.09%  | 99.46%  | 99.79%  | 99.94%  |
| S38584  | 34945         | 97.49%              | 96.97%  | 99.60%  | 99.93%  | 99.99%  |

In all experiments performed on the ISCAS benchmark circuits summarized in Table 1, only four clusters achieved fault coverage of more than 99.5% of the redundant faults. Even three clusters yielded fault coverage in excess of 99%. The spherical pseudorandom patterns characterize complete test sets for large integrated circuits by small amount of data which requires storage. At the same time this biasing provides very good and uniform excitation for the entire circuit, including the areas which contain difficult to test faults. The wind fall coverage is very desirable for non-modeled faults.

Center Pattern Computation Method

Figure 3:
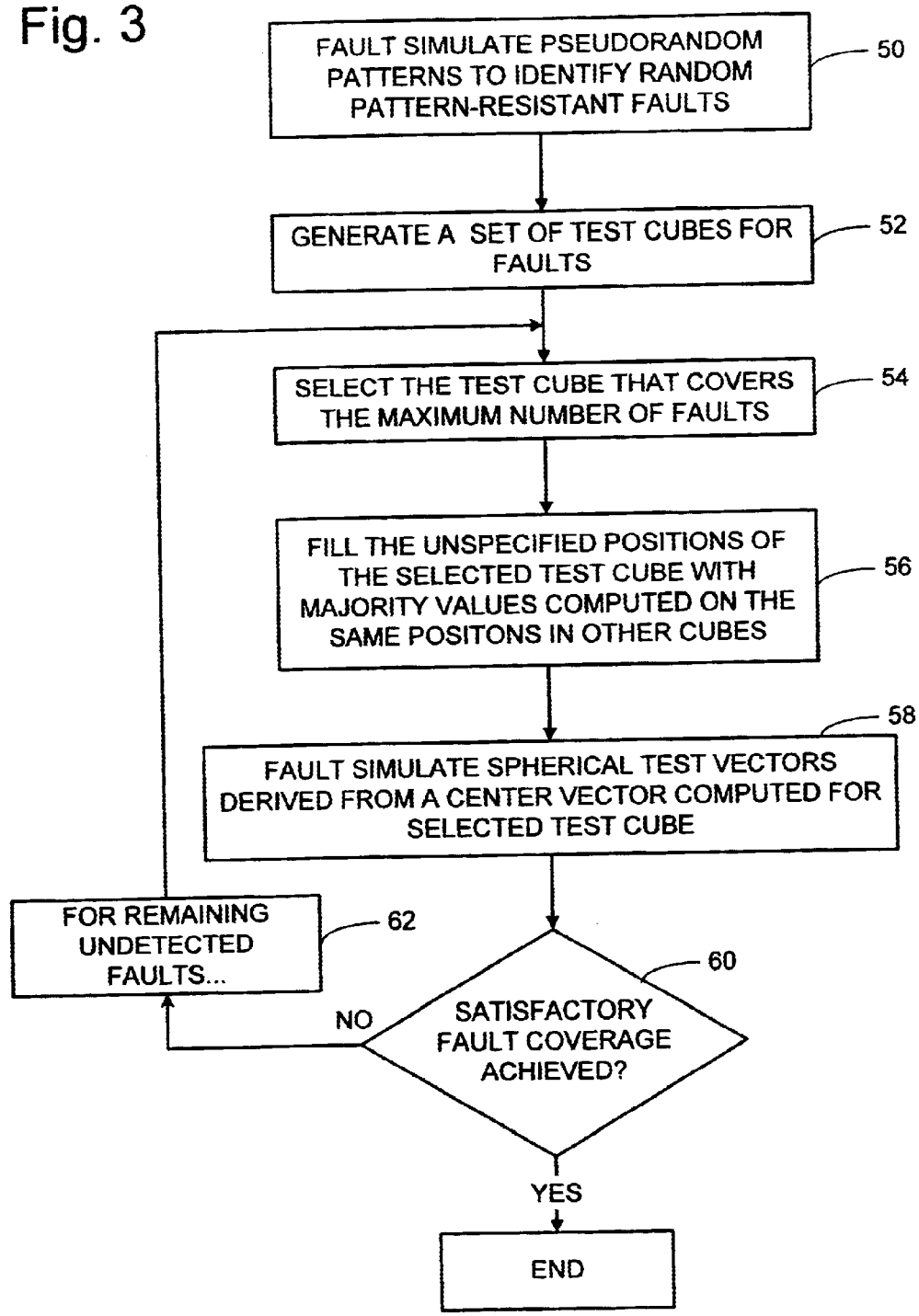
FIG. 3 is a flowchart of a method for determining test patterns for detecting faults within a circuit.

An algorithm to find spherical random patterns is shown in FIG. 3. The algorithms first reads the description of the circuit and performs fault simulation of pseudorandom patterns to identify difficult-to-test faults (50). The ATPG tool reads the list of difficult-to-test faults and determines a set of center test patterns which guarantee acceptable fault coverage (52). To compute one center test pattern the algorithm targets serially a number of faults. It then selects the center with the highest coverage (54), fills the unspecified positions with majority values observed on other center patterns (56), and performs fault simulation for the center pattern and the spherical patterns derived from it with various diffraction probabilities (58). The extent of fault coverage is checked to determine if it has reached a minimally acceptable level (60). If not, the actions 54–58 are repeated for the remaining undetected faults (62). The algorithm terminates when the desirable coverage is obtained. The algorithm also computes the response of the circuit and the corresponding signature. In one embodiment of the invention this data characterizing spherical random patterns controls the automatic test equipment.

When the algorithm shown in FIG. 3 computes a center test pattern there is no knowledge of what faults will be detected by the following centers. It therefore targets all undetected faults.

Test Pattern Generation

Figure 4:
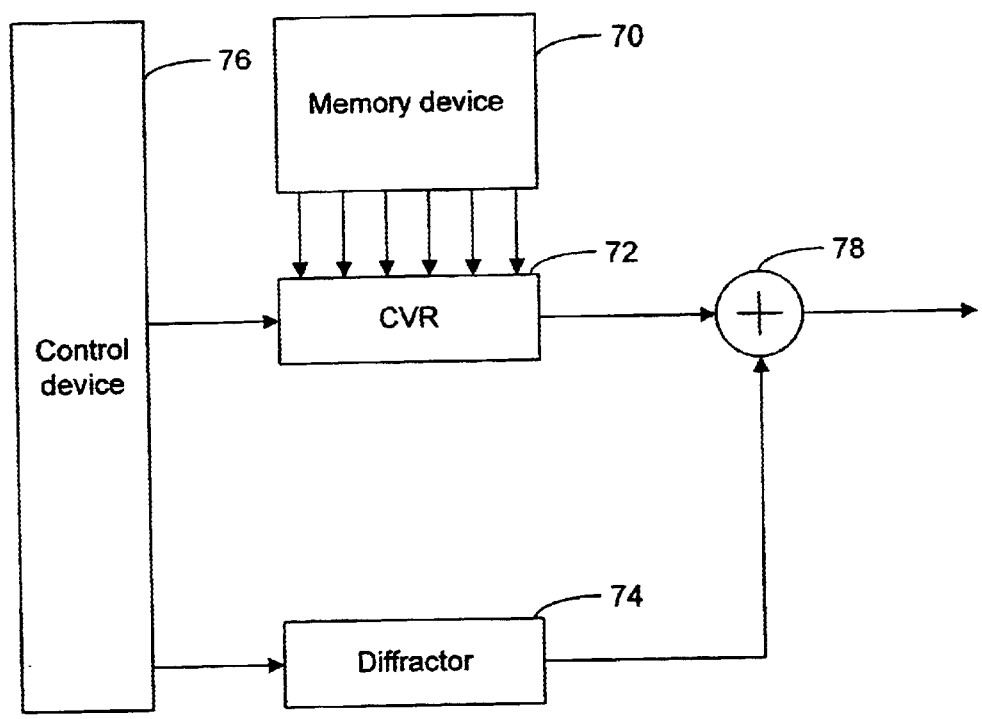
FIG. 4 is a block diagram of a first embodiment of an apparatus for generating multiple weighted test patterns from an initial test pattern.

Tester apparatus according to the invention for generating test pseudorandom patterns is shown in FIG. 4. The tester contains a storage device such as memory 70 to store the center test patterns, a current center pattern register (CVR) 72, and diffractor circuitry 74 all responsive to a control device 76. The output of register 72 and diffractor 74 are logically combined at an EXOR gate 78 to produce a test pattern. The center pattern memory 70 does not have to operate at the same speed as the diffractor 74 and the current center pattern register 72. It could be implemented in a less expensive and slower technology. The diffractor circuit and the current center pattern register, on the other hand, operate at the full tester speed but they are much smaller devices. The tester applies the test to the device by loading the parameters of the diffractor, such as its seed and polynomial, and placing one center test pattern into the fast center pattern register 72. For each test pattern the current center pattern is shifted into the device scan through gate 78 which is also controlled by diffractor circuit 74. The diffractor circuit allows one application of the center pattern to pass unmodified. In other applications of the center pattern, the diffractor device complements some positions of the center pattern. The tester applies a number of derived test patterns, every time complementing different set of positions. Then the memory 70 holding the current pattern is loaded with the next center pattern. The process of generating derived patterns is repeated for every center test pattern.

Complement Disable

Figure 5:
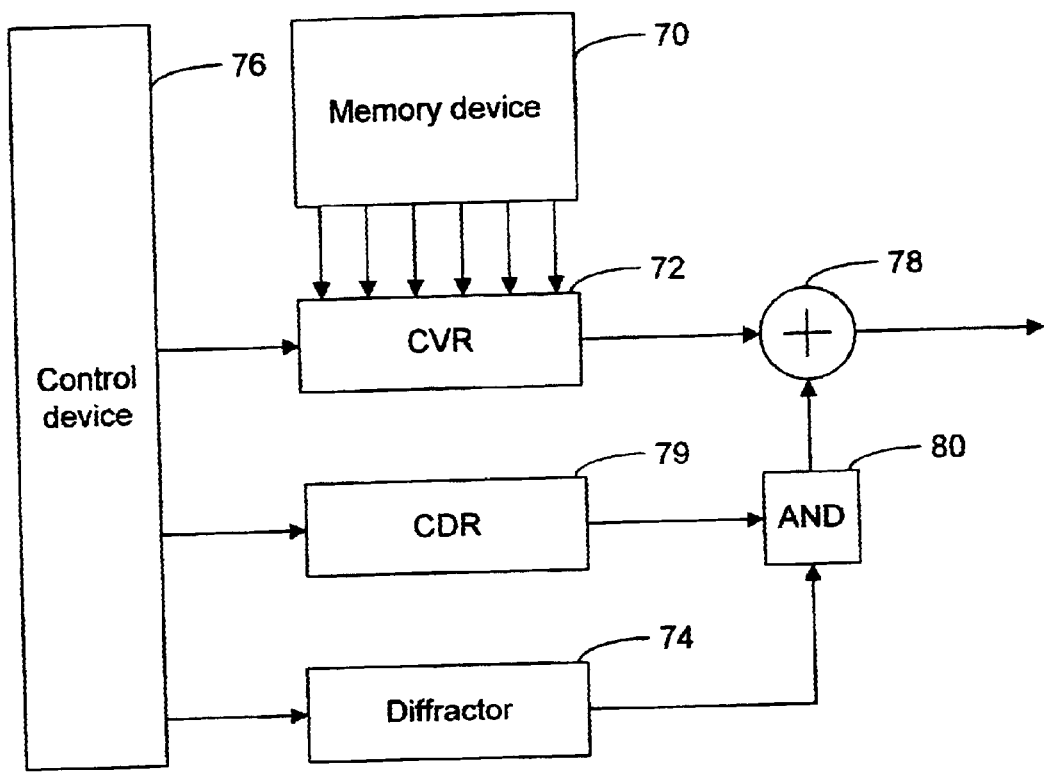
FIG. 5 is a block diagram of a second embodiment of such an apparatus.

Some circuits with scan path impose constraints on the test patterns applied to them to prevent the application of illegal states which could damage the circuit. These input constraints have to be strictly adhered to, and the ATPG tool takes these inputs constraints into account in the generation of the center patterns. These constraints have to be maintained also during application of the derived patterns of the clusters. FIG. 5 shows a tester architecture which is capable of respecting input constraints. A complement disable register 79 and AND gate 80 are added to the tester of FIG. 4. The register 79 contains a binary pattern which for each position of the scan chain has one bit of data indicating whether or not the position may be complemented. If the position is part of an input constraint, the diffractor is disabled.

The Diffractor

Figure 6:
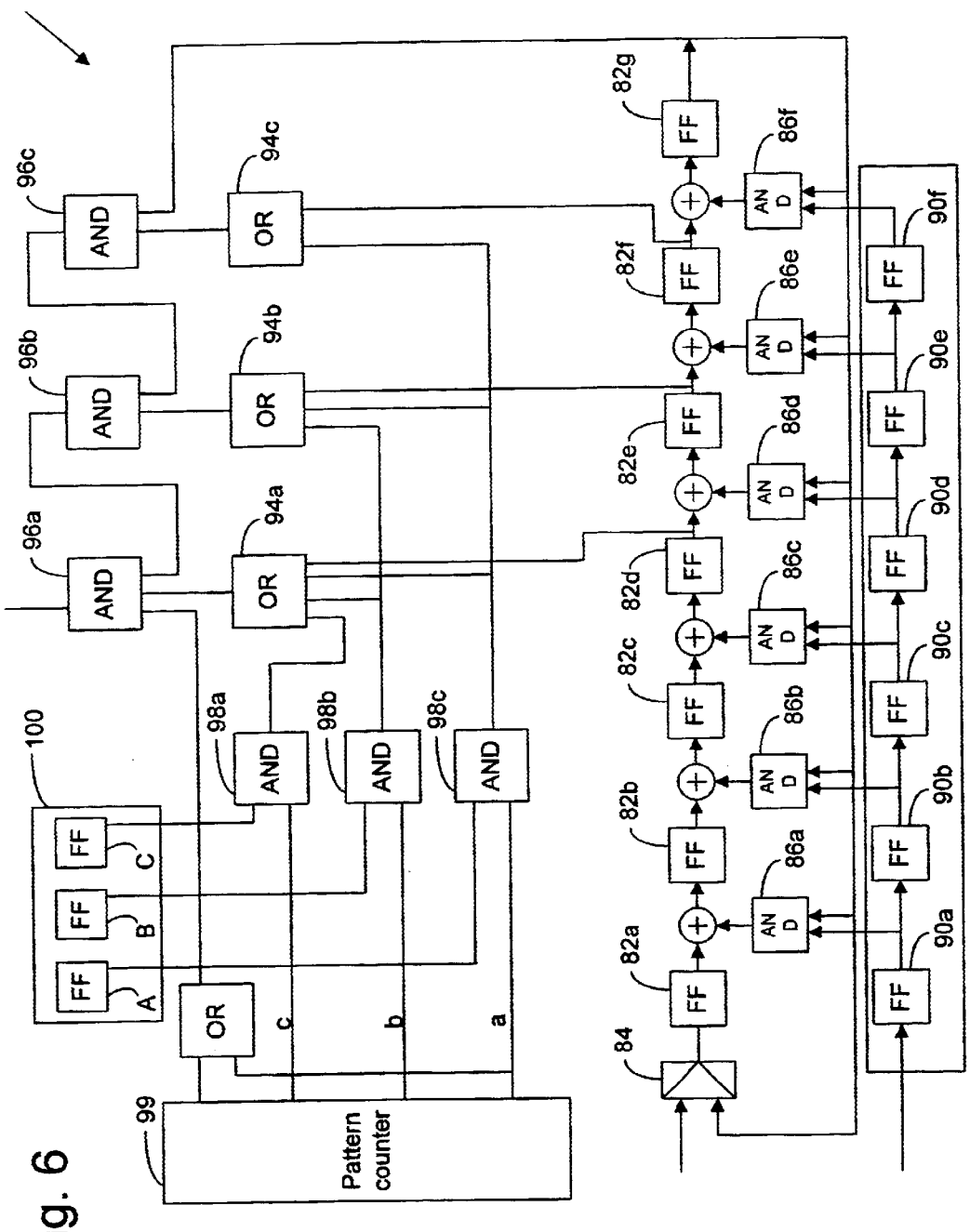
FIG. 6 is a gate level diagram of the first circuit within the apparatus of FIG. 4.

A preferred embodiment of diffractor circuit 74 is shown in FIG. 6. It comprises a number of flip-flops, EXOR gates, AND gates and OR gates. Flip-flops 82a–g form the memory elements of a linear feedback shift register and their initial state is loaded through a multiplexer 84. The flip-flops are separated by EXOR gates which are driven by AND gates 86a–f. Flip-flops 90a–f store the feedback polynomial of the LFSR, and through AND gates 86a–f, determine the active feedback of the LFSR and the sequence of states which it generates. The LFSR is a source of pseudorandom patterns. Each stage of the LFSR generates pseudorandom patterns with signal probability 0.5. Several outputs 92a–c are combined to generate, through OR gates 94a–c and AND gates 96a–c, signals with probability ¼, 1/8, and 1/16. AND gates 98a–c determine the actual signal probability on the circuit output. If all AND gates 98a–c produce 0 on their outputs, the signal probability on the diffractor output is 1/16, if only the top AND gate 98a outputs 1, the signal probability is ⅛. If AND gate 98b enabled, it is ¼. Finally, if AND gate 98c is enabled, the signal probability on the output is ½. AND gates 98a–b are controlled by a pattern counter 99 and a signal distribution register (SDR) 100.

The SDR 100 includes flip-flops A, B, and C which determine what fraction of the test experiment each signal probability will be generated. Table 2 determines the distribution functions. For example with outputs A=1, B=1 and C=1, the diffractor will generate output with signal probability 1/16 for ⅛ of the patterns, ⅛ for ⅛, 1/4 for ¼, and ½ for half of the patterns. With A=B=C=0 the output will generate signals with probability 1/16 for all patterns. By proper selection of values for flip-flops A, B, and C, the number of patterns for each signal probability can be determined.

TABLE 2

| | | | Distribution | | | |
|---|---|---|---|---|---|---|
| A | B | C | 1/16 | 1/8 | 1/4 | 1/2 |
| 0 | 0 | 0 | 1 | 0 | 0 | 0 |
| 0 | 0 | 1 | 1/2 | 1/2 | 0 | 0 |
| 0 | 1 | 0 | 1/2 | 0 | 1/2 | 0 |
| 0 | 1 | 1 | 1/4 | 1/4 | 1/2 | 0 |
| 1 | 0 | 0 | 1/2 | 0 | 0 | 1/2 |
| 1 | 0 | 1 | 1/4 | 1/4 | 0 | 1/2 |
| 1 | 1 | 0 | 1/4 | 0 | 1/4 | 1/2 |
| 1 | 1 | 1 | 1/8 | 1/8 | 1/4 | 1/2 |

The operation of the diffractor starts with loading the feedback polynomial into flip-flops 90, the initial seeds to LFSR flip-flops 82 and the signal distribution register 100, and by resetting the pattern counter 99. The polynomial register 90 will remain unchanged through the test experiment involving the application of the entire cluster of spherical pseudorandom patterns. The LFSR is controlled by the same clock which shifts data through the scan chain of the device under test. The pattern counter 99 is incremented every time one test pattern is completely shifted into the circuit. The duration, or the number of test patterns a signal with a given signal probability is generated by the diffractor, depends on the number of untapped positions of the pattern counter the values in the SDR register 100. If the number of untapped positions is k and ABC=111, then for at least k patterns the signal probability remains the same.

For every position of the SDR which is equal 0, the duration doubles for some signal probabilities at the expense of some other signal probabilities which disappear completely. This way diffractor 74 generates a number of spheres with different signal probabilities. The spheres closer to the center have fewer test patterns, the spheres further away from the center have more.

The selection of spheres and their population is determined by the content of the SDR register 100.

Multiple Channel Test Pattern Generator

Figure 7:
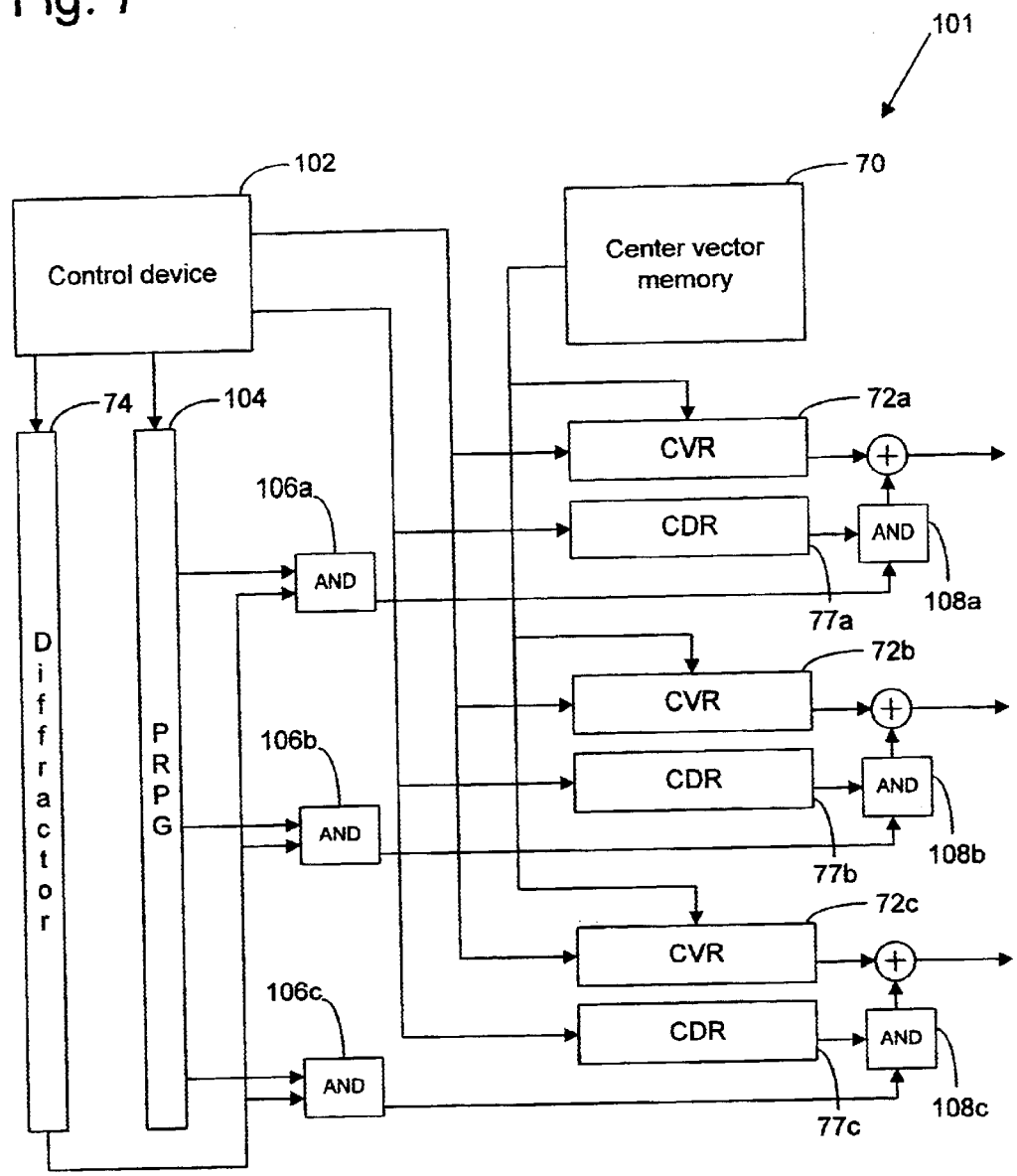
FIG. 7 is a block diagram of a third embodiment of the apparatus of FIG. 4.

FIG. 7 shows a test pattern generator device 101 capable of testing a device under test with multiple scan paths. The multiple channel generator device comprises a control device 102, center pattern memory device 70, diffractor circuit 74, pseudorandom pattern generator device 104, array of AND gates 106a–c, a multiplicity of center pattern registers 72a–c with one register per channel, multiplicity of complement disable registers 79a–c with one register per channel, and a second array of AND gates and EXOR gates 108a–c. The center pattern memory device stores all the center patterns for all scan chains of the device under test. The center test pattern which is currently being applied to the device under test is stored in the CVR register of each channel. The complement disable registers CDRs store one bit of data for every scan cell of the scan chain. This data controls the complement disable function. If the register contains a logic 1, the complement disable function is enabled for the corresponding position of the scan chain and the diffractor circuit can complement it. If the register contains a logic 0, the complement function of the diffractor remains disabled for the corresponding position of the scan chain. The parallel diffraction function is built of a single output diffractor 74, PRPG 104 comprising an LFSR and EXOR cloud logic and an array of AND gates 108a–c. Each AND gate 108a–c is driven by diffractor 74 and one output of the PRPG 104. The signal probability on the outputs of the AND gates is reduced by half compared to the output of the diffractor. It is the same for every AND gate at any given time. This architecture allows sharing of the single output diffractor across many channels, while the addition of PRPG reduces the correlation between signals on the output of the parallel diffractor.

The multiple channel generator 101 starts its operation with loading of the center pattern memory, complement disable registers, the polynomials, initial seeds and signal distribution register of the single output diffractor and the seed of the PRPG. Subsequently the current center pattern is loaded to the CVR registers 72a–c of the individual channels. An application of a single test pattern involves the shifting of the center patterns from the CVR registers into the scan chains of the device under test. As the center patterns are being shifted some of their positions may be complemented by the diffraction signals provided that the position of the scan chain is not covered by an input constraint and disabled. If the complement function for a given position is disabled, for all test pattern generated from a given center, the exact, unchanged value of the center pattern is applied. For all test patterns of a given cluster the same center pattern is applied with the same complement disable pattern. In each application, however, different positions of the center pattern are complemented. As the pattern counter within diffractor 74 changes its value for different groups of test patterns, the diffraction probability also changes according to the content of the SDR register 100 which programs the sequence.

A Digital System Adapted for Spherical Random Pattern Testing

Figure 8:
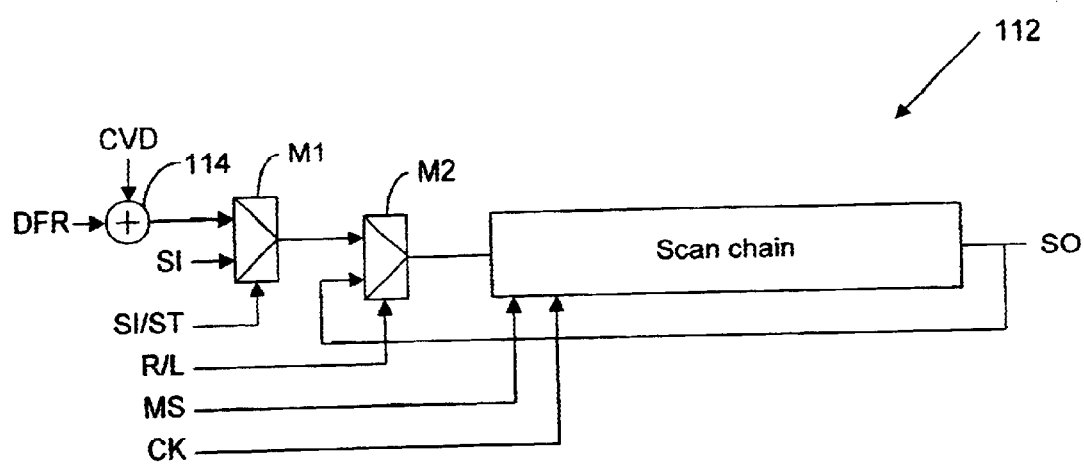
FIG. 8 is a block diagram of apparatus that utilizes a scan chain for built in self testing of a circuit.

FIG. 8 shows a scan path, or chain, 112 of a digital system adapted for testing with spherical pseudorandom patterns. The scan path is extended by two multiplexers M1 and M2 and an EXOR gate 114. It is controlled by a clock CK, scan/system mode select MS, rotate/load select R/L, serial-input/spherical-tests select SI/ST, serial input SI, diffraction signal DFR, and center pattern data input CVD. The scan chain 112 has a feedback connection which allows the data taken from one of the scan cells to be rotated though multiplexer M2.

The control signal R/L of multiplexer M2 selects between rotating a center test pattern and loading of new data. More specifically, it selects between the input port driven by the feedback signal from the scan chain, and the input port for loading data, driven by multiplexer M1 which selects data from either device input SI or from the EXOR gate 114 which provides spherical test patterns. The EXOR gate is driven by a center test pattern input CVD supplied by another scan chain of similar structure and a diffractor device connected to input DFR. To understand the operation of the device, assume that the control input in a multiplexer selects the top port when it is assigned to 0 and the bottom port if it is 1. For example, if control input SI/ST is assigned to 0, it selects the port driven by the output of the EXOR. If it is assigned to 1, it selects the SI input.

Figure 9:
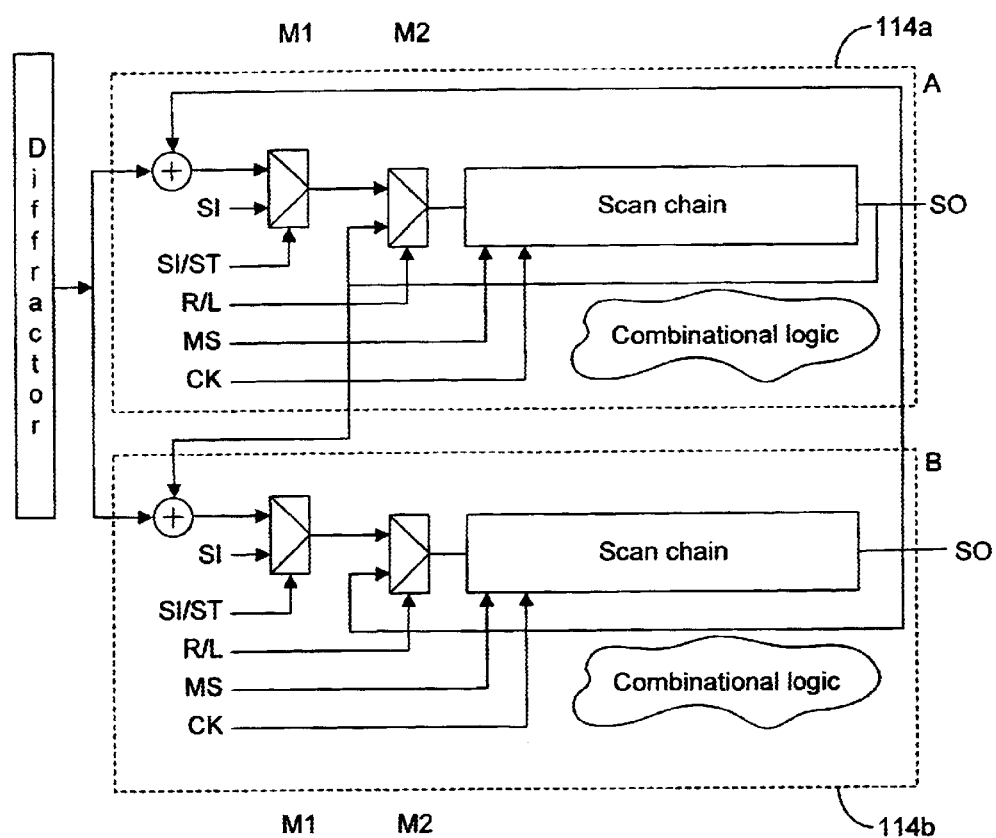
FIG. 9 is a block diagram of apparatus that utilizes a pair of scan chains for built in self testing of a circuit.

FIG. 9 shows a digital system with two such scan chains 114, labeled as A and B. Scan chain A holds center test pattern for scan chain B. The center test pattern is loaded to scan chain A through input SI and multiplexers M1 and M2 by assigning 1 control input SI/ST to select SI port on multiplexer M1, and by assigning 0 to control input R/L to select the port driven by M1, and selecting scan mode operation of the scan chain using MS and clocking the operation with CK. The loading of a test pattern to scan chain B is accomplished by rotating the center test pattern in scan chain A through multiplexer M2 and copying the center test pattern to scan chain B through the EXOR gate and two multiplexers M1 and M2. This configuration is established by assigning R/L in A to 1, MS to scan mode, SI/ST in B to 0, R/L in B to 0. As the center test pattern is being copied to scan chain B, the diffraction device controlling the EXOR gate complements some of the bits. After the test pattern is loaded to scan chain B, the mode select MS input changes for scan chain B to system mode, and the response is loaded to scan chain B. If both scan chains are controlled by the same clock then the length of scan chain A in rotate configuration should be equal to the number of shift operations required to load a new pattern to scan chain B plus the number of cycles it takes to load responses. This way after shifting and applying clock pulses in system mode the center test pattern in A remains aligned and ready for next generation of test pattern concurrently with shifting out the response.

Scan Encoding of a Single Center Pattern

Figure 10:
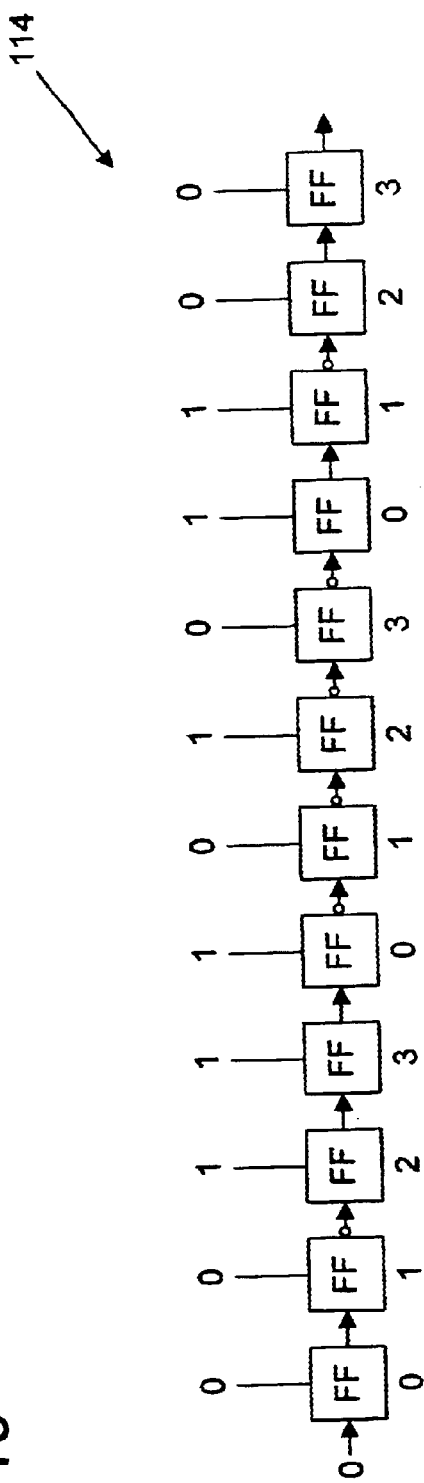
FIG. 10 is an example of a scan chain with a scan encoded test pattern.

FIG. 10 shows a single scan chain 114 comprised of a series of flip-flops with an encoded central test pattern. The scan chain is driven by a logic value 0 for a number of shift cycles equal to the length of the scan chain. The polarity between a given scan cell and its predecessor is selected based on the number of inversions introduced so far and the polarity of the output. Tables 3 and 4 present the method to determine the polarity between scan cells.

TABLE 3

| Input | Inversions | Output true | Connection |
|---|---|---|---|
| 0 | odd | 0 | negative |
| 0 | odd | 1 | true |
| 0 | even | 0 | true |
| 0 | even | 1 | negative |
| 1 | odd | 0 | true |
| 1 | odd | 1 | negative |
| 1 | even | 0 | negative |
| 1 | even | 1 | true |

Tables 3 describes the method of selecting the connection between the current scan cell and its predecessor based on the logic value driving the scan input, the number of inversion inserted so far, and the required value on the output of the scan cell assuming that the true output is used to drive the combinational logic. If, for example, value 0 drives the input to the scan chain, the number of inversions between all scan cells linked so far is odd, and the required value on the true output of the current cell is 0, then the current scan cells should be connected to the negative output of the previous scan cell.

TABLE 4

| Input | Inversions | Output negative | Connection |
|---|---|---|---|
| 0 | odd | 0 | true |
| 0 | odd | 1 | negative |
| 0 | even | 0 | negative |
| 0 | even | 1 | true |
| 1 | odd | 0 | negative |
| 1 | odd | 1 | true |
| 1 | even | 0 | true |
| 1 | even | 1 | negative |

Table 4 describes the same type of relation assuming that a negative output drives the combinational logic. If, for example, value 0 drives the input to the scan chain, the number of inversions between all scan cells linked so far is odd, and the required value on the negative output of the current cell is 0, then the current scan cells should be connected to the true output of the previous scan cell.

The method summarized in Tables 3 and 4 guarantees that if the value controlling the scan chain input and the required value are the same the number of inversions is even. If the values are different the number of inversions is odd. In this way if the controlling value on the scan chain input is asserted and the clock is applied for the number of cycles to fill completely the scan chain, the required values are guaranteed to appear on the outputs.

Encoding of Multiple Center Patterns in Scan

Usually center test patterns are not completely specified. Experimental results indicate that in many cases less than 20% of scan cells have specified values. Other positions assume don't care values, i.e. they can be set to either logic 0 or 1 without affecting the coverage of faults for which they were computed. This incomplete specification can be utilized in encoding of multiple center patterns in a single scan chain. Each center test pattern is generated from the default values obtained by applying a constant to the scan input, scanning the data into the scan chain, and by complementing some positions. For each center pattern this a different set of positions. Although a larger number of center patterns can be encoded in a single scan chain a case with three center patterns will be presented as an example of the method.

Figure 11:
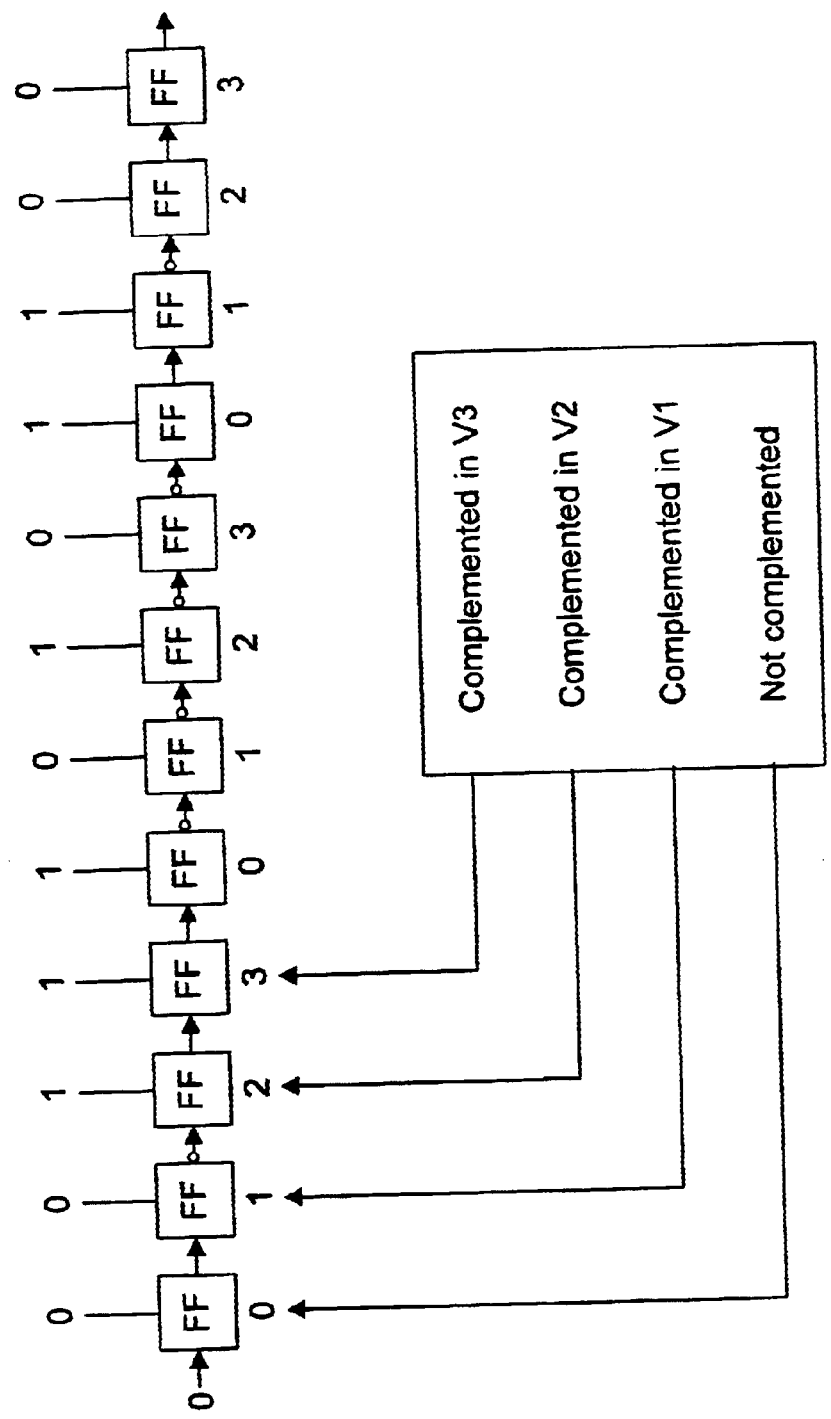
FIG. 11 shows a second example of a scan chain with three scan encoded center test patterns.

The first action involves labeling of scan cells and determining the background pattern value. Each scan cell is labeled to be either never complemented, or complemented in the first, or second, or third center test pattern as illustrated in FIG. 11. Table 5 shows three fully specified center test patterns v1, v2 and v3, and resulting background values bv, as well as the slot type allocation slot. Scan cell a requires value 0 for all three patterns, and therefore no complement is needed. This results in background value 0 and slot 0. Scan cell b requires background value 0 and a complement to produce the first center pattern. It is therefore allocated to slot 1. For fully specified scan cells in three center patterns the background value is always the majority value. There is either no complement or one pattern for which a complement is required.

TABLE 5

| name | a | b | c | d | e | f | g | h |
|---|---|---|---|---|---|---|---|---|
| v1 | 0 | 1 | 0 | 1 | 0 | 1 | 0 | 1 |
| v2 | 0 | 0 | 1 | 1 | 0 | 0 | 1 | 1 |
| v3 | 0 | 0 | 0 | 0 | 1 | 1 | 1 | 1 |
| bv | 0 | 0 | 0 | 1 | 0 | 1 | 1 | 1 |
| slot | 0 | 1 | 2 | 3 | 3 | 2 | 1 | 0 |

TABLE 6

| name | a | b | c | d | e | f |
|---|---|---|---|---|---|---|
| v1 | X | 1 | 0 | 1 | 1 | X | X |
| v2 | 0 | X | X | X | X | 0 | X |
| v3 | 0 | 0 | 0 | 1 | X | X | X |
| bv1 | 0 | 0 | 0 |   | 0 | 0 | 0 |
| slot 1 | 0 | 1 | 0 |   | 1 | 0 | 0–3 |
|   |   |   |   | 1 |   | 1 |   |
|   |   |   | 2 |   |   | 3 |   |
| bv2 |   | 1 |   | 1 | 1 | 1 | 1 |
| slot 2 |   | 3 |   | 02 | 023 | 2 | 0–3 |

Table 6 presents scan cell labeling method for incompletely specified centers. In some cases there are two possible backgrounds, bv1 and bv2, and two possible corresponding lists of slots, slot1 and slot2. Cell a requiring (x,0,0) for the three centers needs value 0 as background, and it can work without complement in slot 0, which results in (0,0,0), or with complement for the first pattern (1,0,0) in slot 1. Cell b (1,x,0) can work with one of two different backgrounds 0 or 1. The corresponding complement is then in pattern 1 or 3 respectively. For cell c (0,x,0) the background is 0 and the label can be no complement resulting in (0,0,0), or complement in v2 producing (0,1,0).

Figure 12:
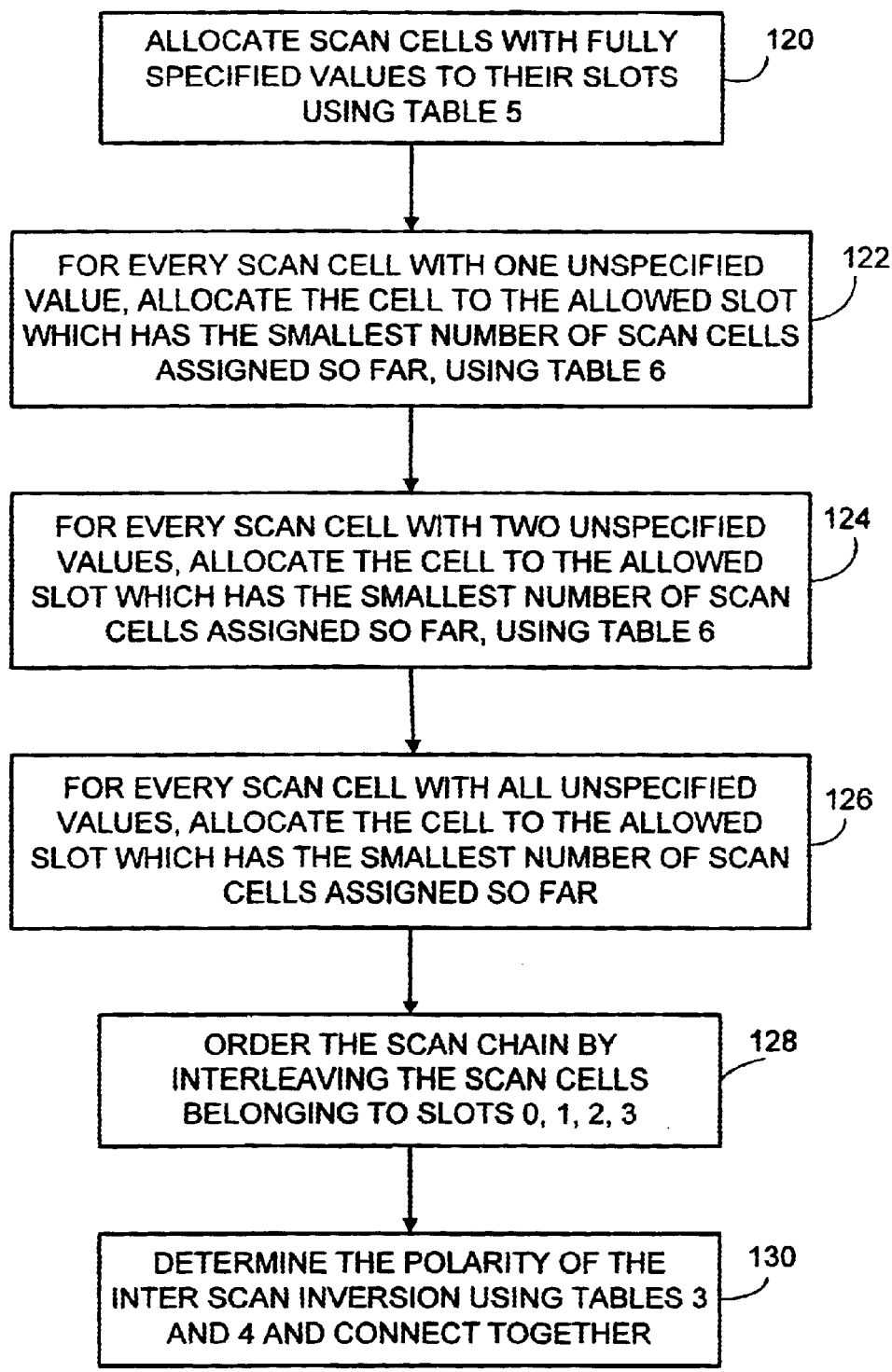
FIG. 12 is a flowchart of a method for determining a scan order.

The initial labeling identifies for each scan cell the types of slots to which it should be assigned. The slot type also indicates the possible locations of the scan cell in the scan chain. For scan cells which do not have fully specified values there is a list of possible slot types. Before the final scan chain order selection is established the slot types are further specified. FIG. 12 presents the algorithm which balances the usage of slot types by maintaining for each slot type the number of scan cells allocated so far. The assignment of scan cells to the slot types is done in four actions 120–126 starting with scan cells with fully specified values, followed by scan cells with a single don't care, followed by two don't cares, and closing with all don't care values. Each scan cell, depending on the number of specified values, could be assigned to one, two or four different slot types; it can have one or two background values. The algorithm selects among the permissible slots and backgrounds the one with the smallest number of assigned scan cells. Once the scan cells are labeled and their background values determined, the scan chain order is established (actions 128–130).

TABLE 7

| name | a | b | c | d | e | f | g | h | i | j | k | l |
|------|---|---|---|---|---|---|---|---|---|---|---|---|
| v1   | 0 | 1 | x | 1 | 0 | x | x | 1 | 1 | 0 | 0 | x |
| v2   | 0 | 0 | 1 | 0 | 0 | 1 | x | 1 | 0 | x | x | 0 |
| v3   | 0 | 1 | 0 | 0 | 1 | x | x | x | 1 | 1 | 0 | 1 |
| bv1  | 0 | 1 | 1 | 0 | 0 | 1 | 0 | 1 | 1 | 0 | 0 | 0 |
| slot | 0 | 2 | 3 | 1 | 3 | 1,3 | 0-3 | 3 | 2 | 3 | 0 | 3,2 |
| bv2  |   |   | 0 |   |   | 0 | 1 |   |   | 1 |   | 1 |
| slots |  |   |   |   |   | 2 | 0-3 |   |   | 1 |   | 2 |

TABLE 8

| name  | a | d | b | c | f | g | i | e | h | j | k | l |
|-------|---|---|---|---|---|---|---|---|---|---|---|---|
| slot  | 0 | 1 | 2 | 3 | 0 | 1 | 2 | 3 | 0 | 1 | 2 | 3 |
| value | 0 | 0 | 1 | 1 | 1 | 0 | 1 | 0 | 1 | 1 | 0 | 0 |
| v1    | 0 | 1 | 1 | 1 | 1 | 1 | 1 | 0 | 1 | 0 | 0 | 0 |
| v2    | 0 | 0 | 0 | 1 | 1 | 0 | 0 | 0 | 1 | 1 | 1 | 0 |
| v3    | 0 | 0 | 1 | 0 | 1 | 0 | 1 | 1 | 1 | 1 | 0 | 1 |

Tables 8 illustrates the execution of the method from the initial requirements shown in Table 7 through scan chain ordering and computation of background values. Scan cells with various labels are ordered in regular patterns to simplify the structure of the wave form generation circuit which generates the complement signals. In this example we order scan cells according to a pattern with the following list of slots types: no complement, complement in v1, complement in v2 and complement in v3. This pattern is repeated throughput the whole scan chain. A constant 0 when applied to the input of the scan chain produces the background value after 12 cycles.

Wave Form Generator

Figure 13:
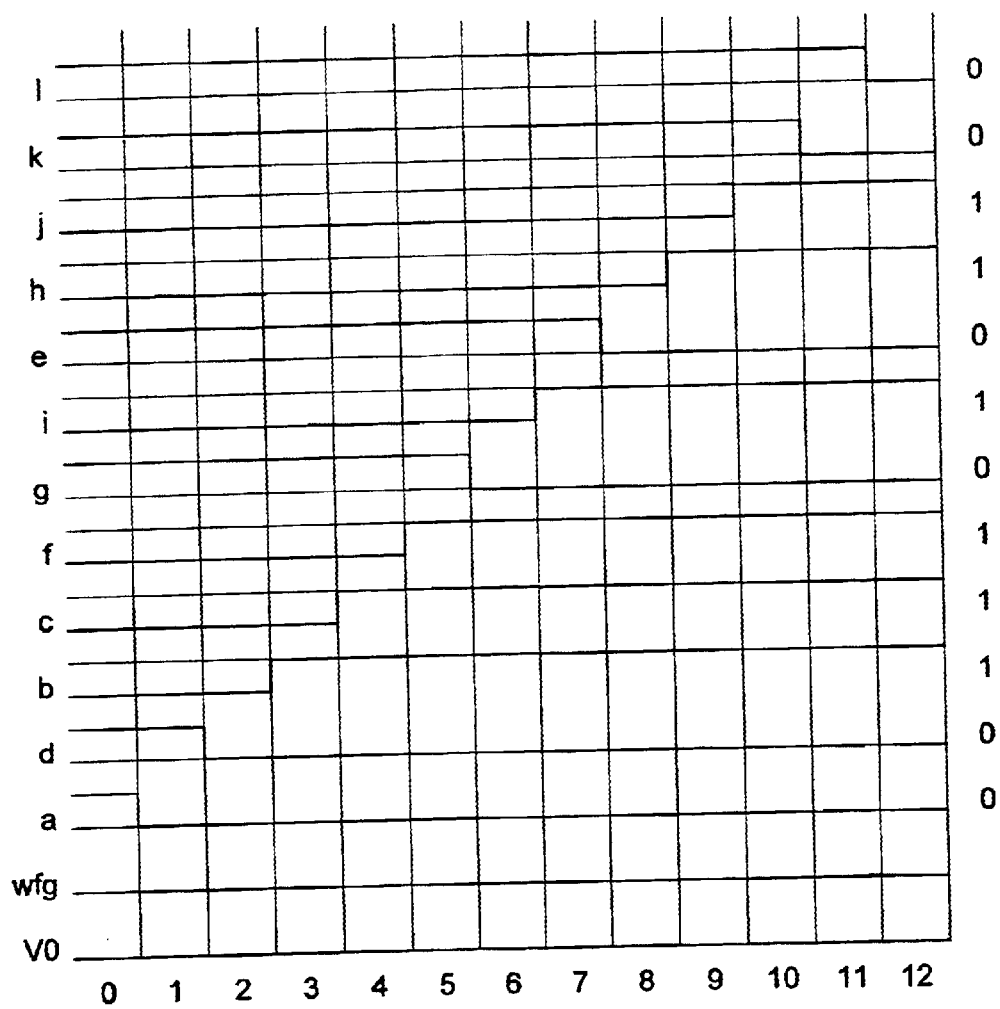
FIGS. 13–16 are graphs showing the wave forms of signals required to reproduce the initial test patterns and the corresponding behavior of the scan chains.
Figure 14:
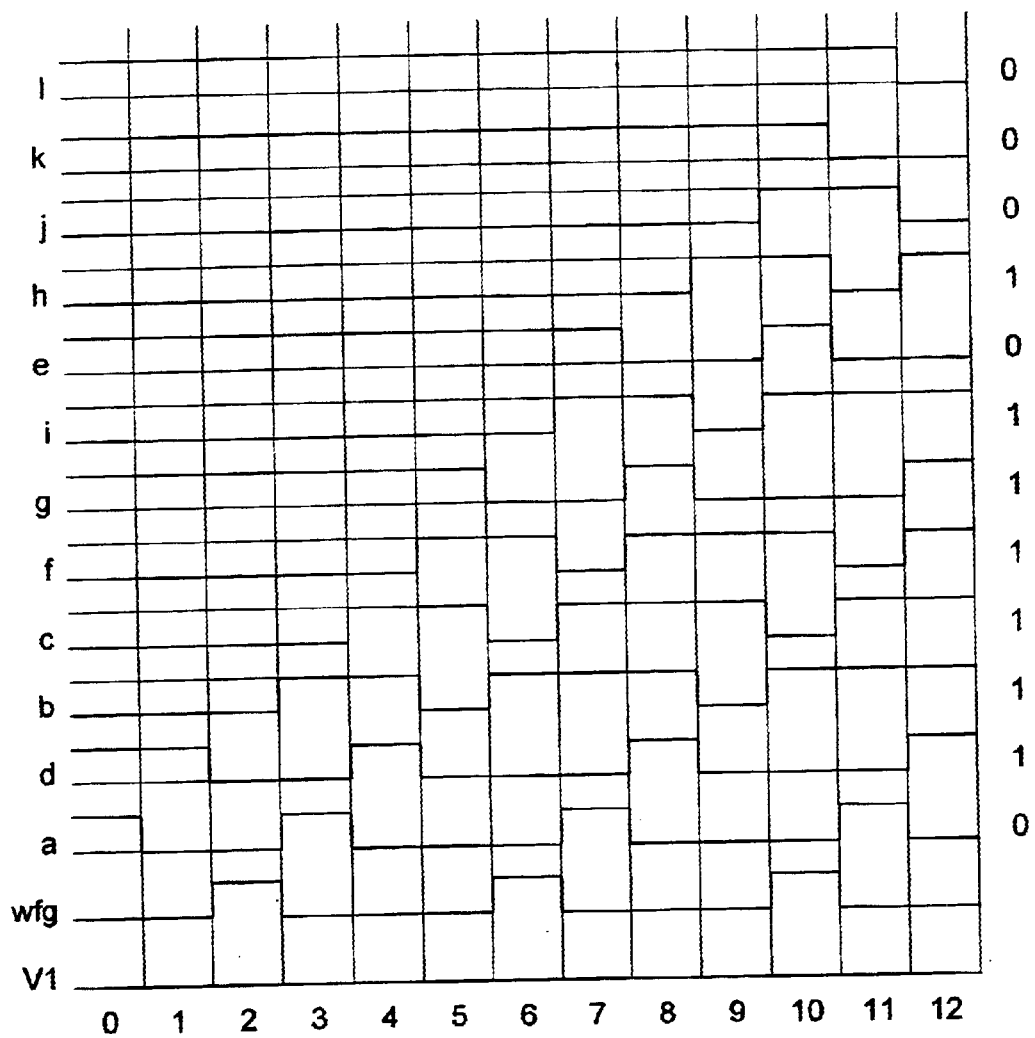
Figure 15:
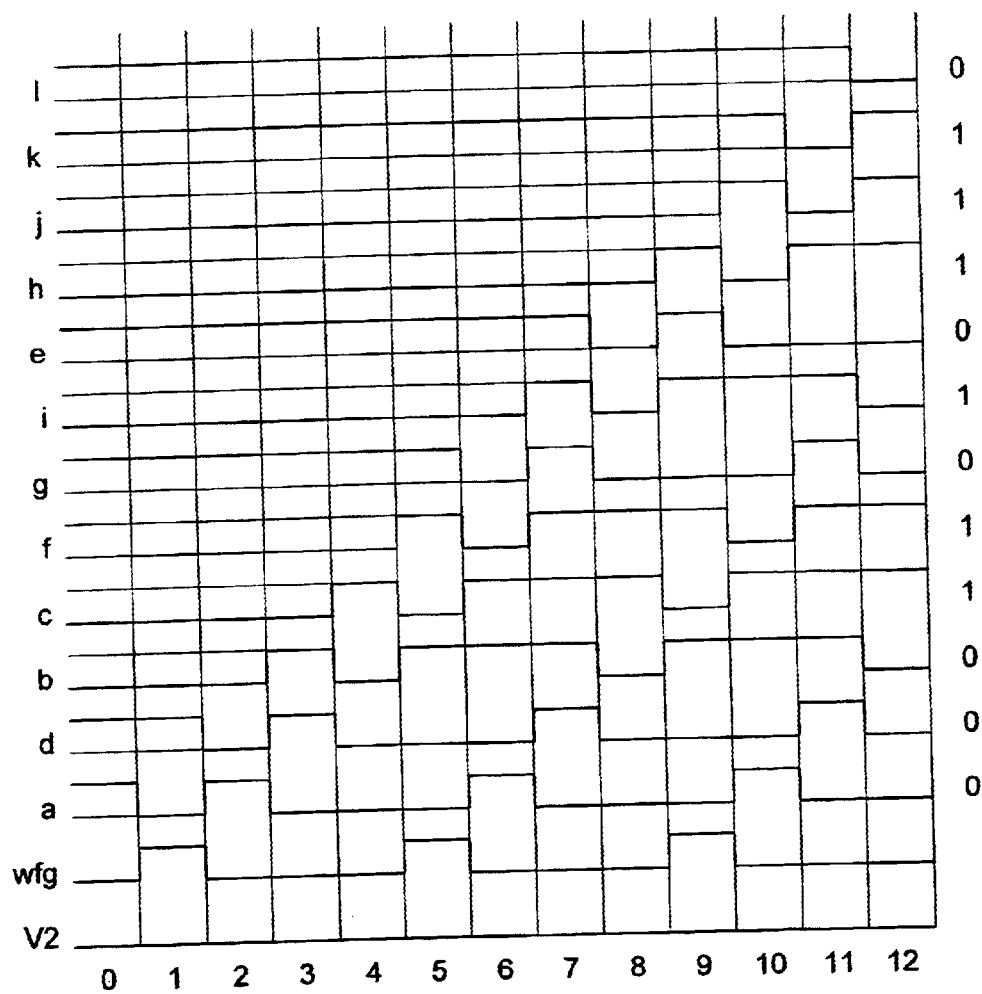
Figure 16:
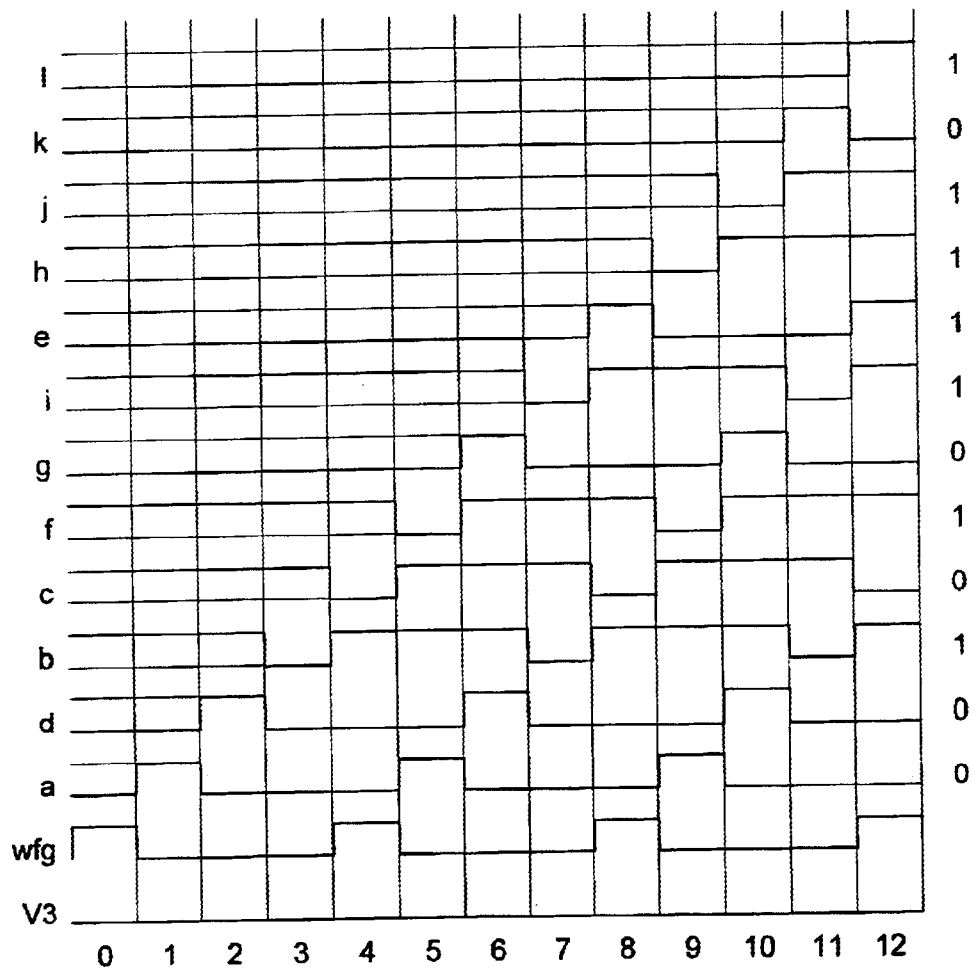

Once the center patterns have been encoded in the scan chain by a proper selection of the scan chain order and polarity, they can be reconstructed by the application of wave form signals. The background values are generated by an application of a constant 0 for 12 consecutive clock cycles as it is shown in FIG. 13. Center patterns V1, V2 and V3 can be obtained by generating periodic signals which complement the background values in slots 1, 2 and 3 as shown in FIGS. 14, 15, and 16. These figures show the response of the scan to these wave forms. Indeed, each of the center patterns is generated after 12 clock cycles in response to the corresponding wave form.

Figure 17:
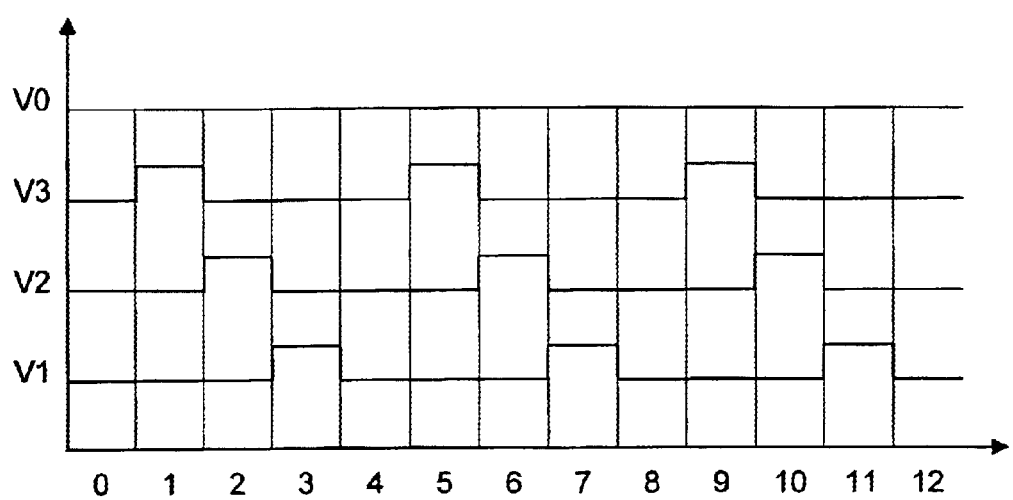
FIG. 17 is a graph showing the wave forms of signals for generating initial test patterns.
Figure 18:
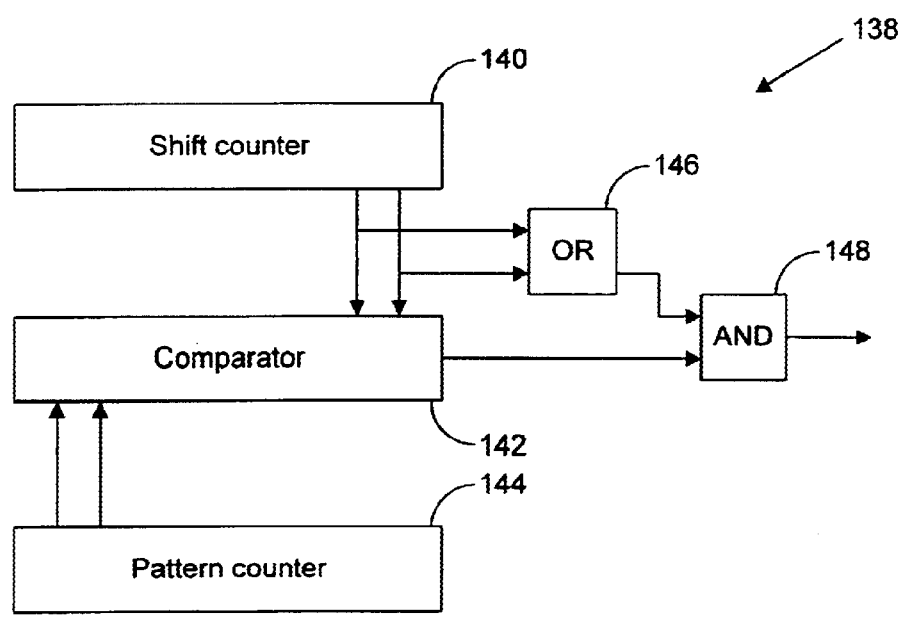
FIG. 18 is a block diagram of a scan chain wave form generator for generating the signals of FIG. 17.

FIG. 17 shows all wave form signals required to stimulate the scan to produce the background pattern as well as the three center patterns. FIG. 18 shows a wave form generator 138 capable of producing these signals. It consists of a shift counter 140, pattern counter 142, comparator 144, OR gate 146, and AND gate 150. The comparator operates on the two least significant bits of the shift counter and two bits of the pattern counter. In this design we assume that the background pattern is complemented if the generator produces 1. For the pattern counter equal 0 on the selected two positions supplied to the comparator, the AND gate is disabled and the VO signal is produced. For test patterns with corresponding value 01 in the pattern counter, the wave form generator produces 1 for every fourth shifted bit with corresponding value 01 in the shift counter. Similarly, for test patterns with value 10 in the pattern counter, the output of the generator is set to 1 only if the shift counter contains 10. Finally a similar relation occurs for patterns corresponding to value 11 in the pattern counter. In this case the output is activated only if the shift counter equals 11 on the two least significant positions. Clearly these three wave form signals activate the generator for different and disjoint time slots.

BIST Generator

The wave form generation device combined with the scan encoded patterns is capable of reproducing center test patterns at the scan cell outputs, or inputs of the combinational logic. In fact, the wave form generator shown in FIG. 18, if connected directly to the scan chain with encoded center test patterns, will produce each center pattern many times. If all the patterns permitted by the capacity of the pattern counter are applied, each center pattern is applied for one forth of the test patterns.

Figure 19:
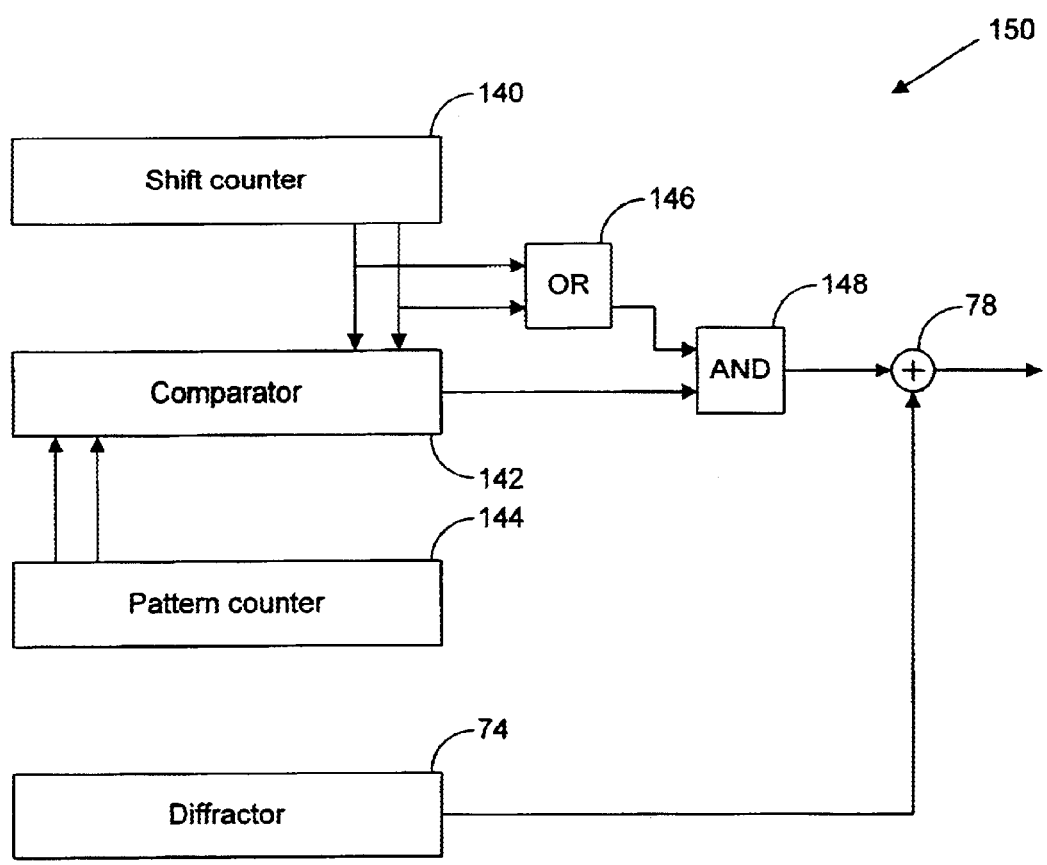
FIG. 19 is a block diagram of a scan chain generator for generating scan encoded test patterns derived from an initial test pattern.

FIG. 19 shows a complete wave form generator 150 of scan encoded spherical random patterns. It comprises a wave form generator 138, an EXOR gate 78 and a diffractor circuit 74 which complements some bits as they are being shifted to the scan chain. The wave form generator 150 generates waveform signals which produce the center patterns on the outputs of the scan cells. Each center test pattern is generate multiple times. Only one application of the any center is unmodified. In every other application of a center pattern some positions of its positions are complemented by the diffraction circuit. For those positions diffractor 74 produces 1 on the input of EXOR gate 78 which in turn complements the value produced by the wave form generator. In every new application of a center pattern, diffractor 74 complements its different positions.

BIST Architecture

Figure 20:
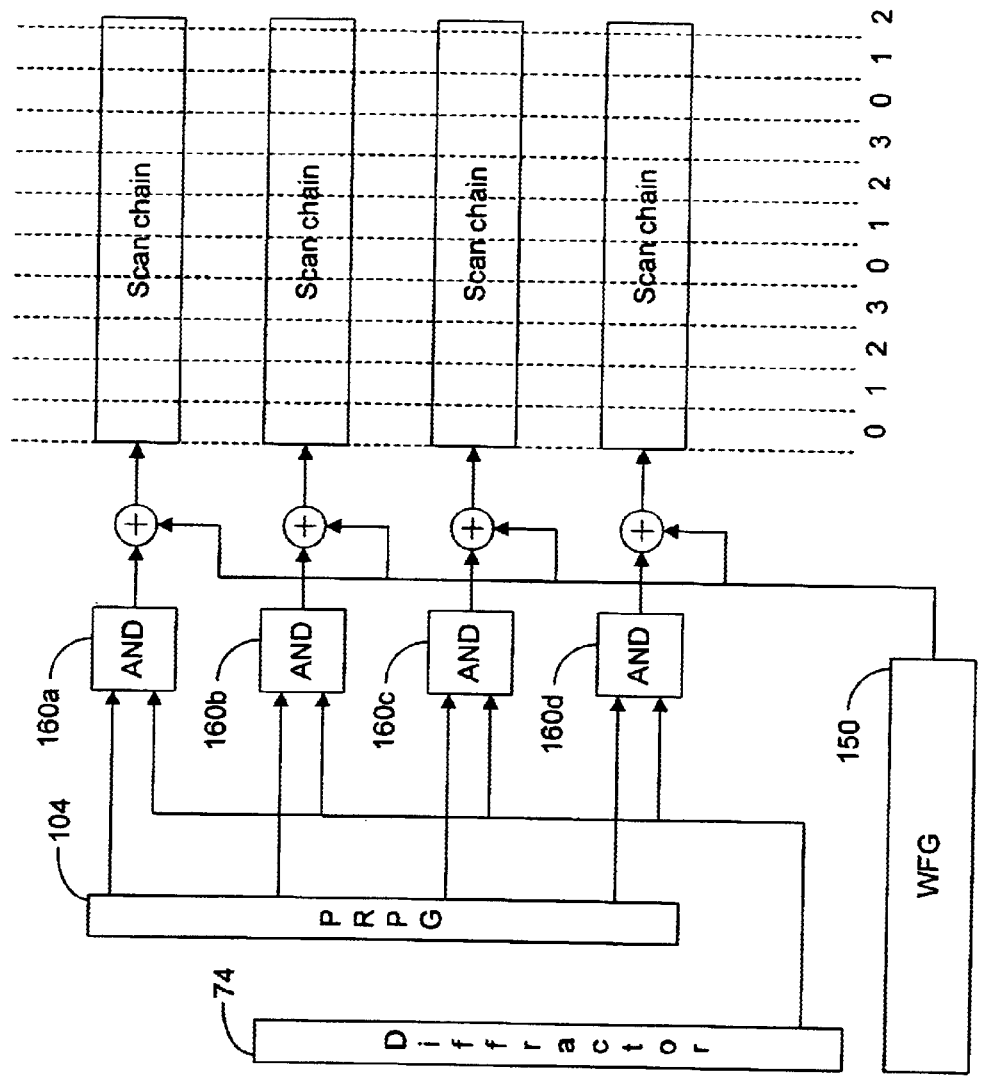
FIG. 20 is a block diagram of a multiple scan chain generator for generating scan encoded test patterns derived from initial test patterns.

In most practical circuits, the scan path is divided into multiple scan chains. The scheme to generate scan encoded spherical pseudorandom patterns in multiple scan design is shown in FIG. 20. The scheme involves a wave form generator 150, a pseudorandom pattern generator (PRPG) 104*a*, diffractor 74, and multiplicity of AND and EXOR gates 160*a–d* which drive the scan chains 114*a–d*. Each output of the PRPG drives one AND gate which is also driven by the diffractor circuit. The outputs of the AND gates generate multiple uncorrelated diffraction signals. These signals complement the wave forms produced by the wave form generator. The method to encode center test patterns in multiple scan chains involves ordering each scan chain according to the same sequence of slots starting from the scan chain inputs. The scan cells driven directly by the EXOR gates should belong to the same slot type, e.g. 0. They should be followed by slot 1, 2, 3, and sequence should be repeated in each scan chain. Each wave form generates its corresponding center test pattern on all scan chains at the same time. In repeated applications of the same center, the diffractor circuit complements some positions generating spherical patterns.

In view of the many possible embodiments to which the principles of my invention may be applied, it should be recognized that the illustrated embodiment is only a preferred example of the invention and should not be taken as a limitation on its scope. The following claims, rather than the illustrated embodiment, define the scope of the invention. I therefore claim as my invention all that comes within the scope and spirit of these claims.

I claim:

1. Apparatus for generating multiple weighted test patterns from an initial test pattern comprising:

memory storing a computed multibit initial test pattern from an initial location multiple times;

a first circuit generating weighting factor bits; and a second circuit combining the weighting factor bits with the stored initial test pattern bits to form a multibit weighted test pattern, the first circuit generating multiple sets of weighting factor bits for combining with multiple copies of the initial test pattern to form multiple weighted test patterns.

2. The apparatus of claim 1 wherein the memory is a shift register, and the circuit combines the initial test pattern bits as they are shifted from the shift register with weighting factor bits to form a stream of weighted test pattern bits.

3. The apparatus of claim 1 wherein the second circuit comprises an XOR circuit.

4. The apparatus of claim 1 wherein the first circuit is constructed to generate a stream of weighting factor bits for combining with the copied initial test pattern bits to form a stream of weighted test pattern bits.

5. The apparatus of claim 1 wherein the first circuit comprises:

a linear feedback shift register with programmable polynomial and seed for generating a stream of bits;

a signal distribution register that determines a signal probability applied to portions of the stream of bits; and a logic network that applies the signal probability to the stream of bits to generating the weighting factor bits.

6. The apparatus of claim 1 including a disable register for generating bits that enable or disable the weighting factor bits before combination of the weighting factor bits with the copied initial test pattern bits.

7. Apparatus for generating multiple weighted test patterns from an initial test pattern comprising:

memory storing a multibit initial test pattern from an initial location multiple times;

a first circuit generating weighting factor bits;

a second circuit combining the weighting factor bits with the stored initial test pattern bits to form a multibit weighted test pattern, the first circuit generating multiple sets of weighting factor bits for combining with multiple copies of the initial test pattern to form multiple weighted test patterns; and a disable register for generating bits that enable or disable the weighting factor bits before combination of the weighting factor bits with the copied initial test pattern bits.

8. A method for generating multiple weighted test patterns from an initial test pattern comprising:

copying a multibit initial test pattern from an initial location;

generating a set of weighting factor bits;

combining the weighting factor bits with the copied initial test pattern bits to form a multibit weighted test pattern; and repeating the copying, generating and combining to form multiple weighted test patterns from the initial test pattern.

9. The method of claim 8 wherein:

the copying comprises shifting the initial test pattern to form a stream of initial test pattern bits;

the generating comprises generating a stream of weighting factor bits; and the combining comprises combining the stream of initial test pattern bits with the stream of weighting factor bits to form a stream of weighted test pattern bits.

10. The method of claim 8 wherein the combining comprises XORing the shifted initial test pattern bits with the weighting factor bits.

11. The method of claim 8 wherein the generating comprises:

generating a stream of bits;

determining a signal probability applied to portions of the stream of bits; and applying the signal probability to the stream of bits to generating the weighting factor bits.

12. The method of claim 8 including generating bits that enable or disable the weighting factor bits before combination of the weighting factor bits with the copied initial test pattern bits.

13. A method for determining a test pattern for detecting faults within a circuit, the method comprising:

performing a fault simulation of the circuit to identify a list of random pattern-resistant faults therein;

generating a set of multi-bit test patterns that detects a desired share of the random pattern-resistant faults;

selecting from the set a center vector test pattern that detects a desired number of the random pattern-resistant faults; and filling one or more don't care bit positions of the selected test pattern with bit values computed from the unselected test.

14. The method of claim 13 including:

deriving a set of test patterns from the selected test pattern;

performing a fault simulation of the circuit with the set of derived test patterns;

repeating the deriving and performing for a number of sets; and determine which set of derived test patterns detects a desired share of random pattern-resistant faults.

15. The method of claim 14 wherein the deriving comprises:

applying one or more signal probabilities to a set of multibit test patterns to generate weighting factor bits; and combining the weighting factor bits with the determined test pattern bits to form derived test patterns.

16. The method of claim 15 wherein the applying comprises:

dividing a set of multibit test patterns into subsets;

assigning to each subset a signal probability;

generating the multibit test patterns; and applying the assigned signal probability to the generated test patterns of a subset to generate the weighting factor bits.

17. Apparatus for generating multiple weighted test patterns from an initial test pattern for a circuit under test having multiple scan paths, the apparatus comprising:

memory storing a multibit initial test pattern from an initial location multiple times;

a plurality of test pattern registers for receiving copies of the initial test pattern;

a random pattern generator for simultaneously generating multiple, different random streams of bits;

a first circuit generating a stream of weighting factor bits;

a circuit combining copies of the weighting factor bits stream with random bits streams to generate non-correlated copies of the weighting factor bits stream; and a circuit combining non-correlated copies of the weighting factor bits stream with initial test pattern bit streams from the test pattern registers to form multibit weighted test patterns for the multiple scan paths.

18. Apparatus within a circuit for built in self test of the circuit comprising:

a first scan chain shifting and rotating a multibit initial test pattern;

a combining circuit for combining weighting factor bits with the shifted initial test pattern bits to form a multibit weighted test pattern; and a second scan chain receiving and applying the multibit weighted test pattern to the circuit under test, the rotation of the scan chain producing multiple copies of the center test pattern for combination with multiple sets of weighting factor bits to form multiple weighted test patterns for testing the circuit under test.

19. A method for use within a circuit for built in self testing of the circuit, the method comprising the following steps:

shifting and rotating a multibit initial test pattern through a first scan chain;

combining weighting factor bits with the shifted initial test pattern bits to form a multibit weighted test pattern;

receiving the multibit weighted test pattern in a second scan chain for application to the circuit under test; and repeating the steps of shifting and rotating, combining, and receiving to form multiple weighted test patterns for testing the circuit.

20. An apparatus for generating multiple test patterns from a center test pattern, comprising:

a register to store the center test pattern;

a diffractor to generate a complement signal to complement desired bits of the center test pattern; and one or more logic gates combining the complement signal with the center test pattern to generate multiple test patterns from the center test pattern.

21. The apparatus of claim 20, further including a complement disable register having an output that is logically combined with the complement signal from the diffractor to disable the complement signal.

22. Apparatus for generating multiple weighted test patterns from an initial test pattern comprising:

a center vector register storing a multibit center vector from an initial location multiple times;

a first circuit generating weighting factor bits; and a second circuit combining the weighting factor bits with the center vector bits to form a multibit weighted test pattern, the first circuit generating multiple sets of weighting factor bits for combining with multiple copies of the center vector to form multiple weighted test patterns.

23. The apparatus of claim 22, further comprising a disable register for generating bits that enable or disable the weighting factor bits before combination of the weighting factor bits with the center vector bits.

24. An apparatus for generating parallel multiple test patterns from at least one center test pattern, comprising:

at least one register to store the at least one center test pattern;

a parallel diffractor to generate complement signals to complement desired bits of the at least one center test pattern;

a pseudo random pattern generator to reduce correlation between signals coming out of the parallel diffractor;

at least one complement disable register having an output that is logically combined with one of the complement signals from the parallel diffractor to disable the complement signal; and one or more logic gates combining the at least one complement signal with the at least one center test pattern to generate parallel multiple test patterns from the at least one center test pattern.

* * * * *